(12) United States Patent
Ryu et al.

(10) Patent No.: US 12,733,249 B2
(45) Date of Patent: Sep. 8, 2026

(54) SEMICONDUCTOR DEVICE INCLUDING A PLURALITY OF GATE LINES ON A PLURALITY OF FIN STRUCTURES HAVING DIFFERENT WIDTH PORTIONS

(71) Applicant: SAMSUNG ELECTRONICS CO., LTD., Suwon-si (KR)

(72) Inventors: Hyungju Ryu, Suwon-si (KR); Sangjin Kim, Suwon-si (KR); Yigwon Kim, Suwon-si (KR); Changmin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 494 days.

(21) Appl. No.: 18/365,452

(22) Filed: Aug. 4, 2023

(65) Prior Publication Data

US 2024/0055425 A1 Feb. 15, 2024

(30) Foreign Application Priority Data

Aug. 10, 2022 (KR) ........................ 10-2022-0099698

(51) Int. Cl.
*H10D 84/83* (2025.01)
*H10D 30/67* (2025.01)
*H10D 62/10* (2025.01)

(52) U.S. Cl.
CPC ......... *H10D 84/83* (2025.01); *H10D 30/6735* (2025.01); *H10D 62/121* (2025.01)

(58) Field of Classification Search
CPC .. H10D 84/83; H10D 30/6735; H10D 62/121; H10D 30/62; H10D 84/0151; H10D 84/0135
See application file for complete search history.

(56) References Cited

U.S. PATENT DOCUMENTS

| | | | |
|---|---|---|---|
| 9,425,106 | B1 | 8/2016 | Xie et al. |
| 10,217,816 | B2 | 2/2019 | Bhuwalka et al. |
| 10,832,971 | B2 | 11/2020 | Venigalla et al. |
| 11,296,199 | B2 | 4/2022 | Ju et al. |
| 2017/0213741 | A1 | 7/2017 | Cheng et al. |

(Continued)

FOREIGN PATENT DOCUMENTS

| | | | |
|---|---|---|---|
| KR | 10-2014-0036446 | A | 3/2014 |
| KR | 10-2021-0054753 | A | 5/2021 |
| KR | 10-2021-0128661 | A | 10/2021 |

*Primary Examiner* — Changhyun Yi
(74) *Attorney, Agent, or Firm* — Wolf, Greenfield & Sacks, P.C.

(57) ABSTRACT

A semiconductor device is provided, the semiconductor device including; a substrate; a first fin structure extending on the substrate in a first direction, and having a first fin portion having a first width and a second fin portion having a second width; a second fin structure extending on the substrate in the first direction, and having the second width; first gate lines disposed on the first fin portion and the second fin structure, and extending in a second direction; second gate lines disposed on the second fin portion and the second fin structure, and extending in the second direction; a third gate line disposed on the second fin structure, and extending in the second direction between the first and second gate lines; and a device isolation pattern connected to an end portion of the third gate, and extending between the first and second fin portions.

20 Claims, 18 Drawing Sheets

(56) References Cited

U.S. PATENT DOCUMENTS

| | | | |
|---|---|---|---|
| 2020/0075428 | A1 | 3/2020 | Venigalla et al. |
| 2021/0296304 | A1 | 9/2021 | Liaw |
| 2023/0402444 | A1 * | 12/2023 | Huang ................. H10D 84/853 |

* cited by examiner

SEMICONDUCTOR DEVICE INCLUDING A PLURALITY OF GATE LINES ON A PLURALITY OF FIN STRUCTURES HAVING DIFFERENT WIDTH PORTIONS

CROSS-REFERENCE TO RELATED APPLICATION

This application claims the priority and benefit of Korean Patent Application No. 10-2022-0099698, filed on Aug. 10, 2022, with the Korean Intellectual Property Office, the disclosures and inventive concepts of which are incorporated herein by reference in their entirety.

BACKGROUND

The present inventive concept relates to a semiconductor device.

As demand for high performance, high speed, and/or multifunctionality of a semiconductor device increases, a degree of integration of the semiconductor device is increasing. In addition, a semiconductor device may be required to have a high operating speed and also operational accuracy.

In order to address limitations of operating characteristics due to the size reduction of planar metal oxide semiconductor FETs, efforts are being made to develop semiconductor devices having a three-dimensional channel structure.

SUMMARY

An aspect of the present inventive concept is to provide a semiconductor device having improved degree of design freedom and reliability.

According to an aspect of the present inventive concept, a semiconductor device is provided, the semiconductor device including; a substrate; a first fin structure extending on the substrate in a first direction, and having a first fin portion having a first width in a second direction crossing the first direction and a second fin portion having a second width in the second direction, greater than the first width; a second fin structure extending on the substrate in the first direction, and having the second width in the second direction; a plurality of first gate lines that comprises a first gate line, on the first fin portion of the first fin structure and the second fin structure, wherein the plurality of first gate lines is extending in the second direction; a plurality of second gate lines that comprises a second gate line, on the second fin portion of the first fin structure and the second fin structure, wherein the plurality of second gate lines is extending in the second direction; a third gate line on the second fin structure, wherein the third gate line is extending in the second direction between the first gate line and the second gate line; and a device isolation pattern connected to an end portion of the third gate line, and extending between the first fin portion of the first fin structure and the second fin portion of the first fin structure.

According to an aspect of the present inventive concept, a semiconductor device is provided, the semiconductor device including: a substrate; a first fin structure extending on the substrate in a first direction, and having a first fin portion having a first width in a second direction crossing the first direction and a second fin portion having a second width, greater than the first width, in the second direction; a second fin structure extending on the substrate in the first direction, and having the second width in the second direction; first gate lines on the first fin portion and the second fin structure, and extending in the second direction; second gate lines on the second fin portion and the second fin structure, and extending in the second direction; a third gate line on the second fin structure, and extending in the second direction between the first gate lines and the second gate lines, the first and second gate lines and the third gate line being arranged at a same pitch in the first direction; a first epitaxial pattern on the first fin portion, wherein the first epitaxial pattern is adjacent to the second fin portion; a second epitaxial pattern on the second fin portion, wherein the second epitaxial pattern is adjacent to the first fin portion; and a device isolation pattern separating the first fin portion and the second fin portion between the first epitaxial pattern and the second epitaxial pattern, and connected to an end portion of the third gate line.

According to an aspect of the present inventive concept, a semiconductor device is provided, the semiconductor device including: a substrate; a first fin structure extending on the substrate in a first direction, and having a first fin portion having a first width in a second direction crossing the first direction and a second fin portion having a second width in the second direction, greater than the first width; a second fin structure extending on the substrate in the first direction, and having the second width in the second direction; first gate lines extending in the second direction on the first fin portion and the second fin structure, and arranged at a first pitch in the first direction; second gate lines extending in the second direction on the second fin portion and the second fin structure, and arranged at the first pitch in the first direction; a third gate line on the second fin structure, wherein the third gate line is extending in the second direction between the first gate lines and the second gate lines, and the third gate line is arranged with the first and second gate lines, adjacent thereto, at a second pitch in the first direction, greater than the first pitch; a first epitaxial pattern on the first fin portion, wherein the first epitaxial pattern is adjacent to the second fin portion; a second epitaxial pattern on the second fin portion, wherein the second epitaxial pattern is adjacent to the first fin portion; and a device isolation pattern separating the first fin portion and the second fin portion between the first epitaxial pattern and the second epitaxial pattern, and connected to an end portion of the third gate line.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
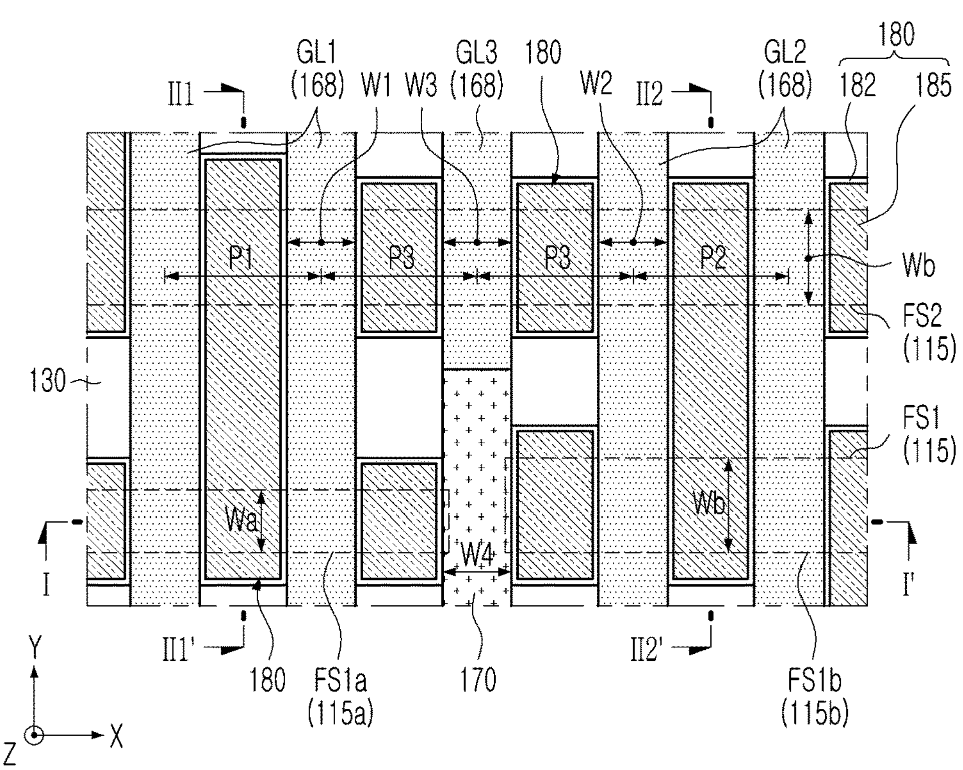
FIG. 1 is a plan view illustrating a semiconductor device according to an example embodiment of the present inventive concept.

Hereinafter, embodiments of the present inventive concept will be described with reference to the accompanying drawings. Hereinafter, terms such as 'an upper side, 'an upper portion,' 'an upper surface,' a lower side, a lower portion, a lower surface, and the like, may be understood as referring to the drawings, except where otherwise indicated by reference numerals.

Figure 2:
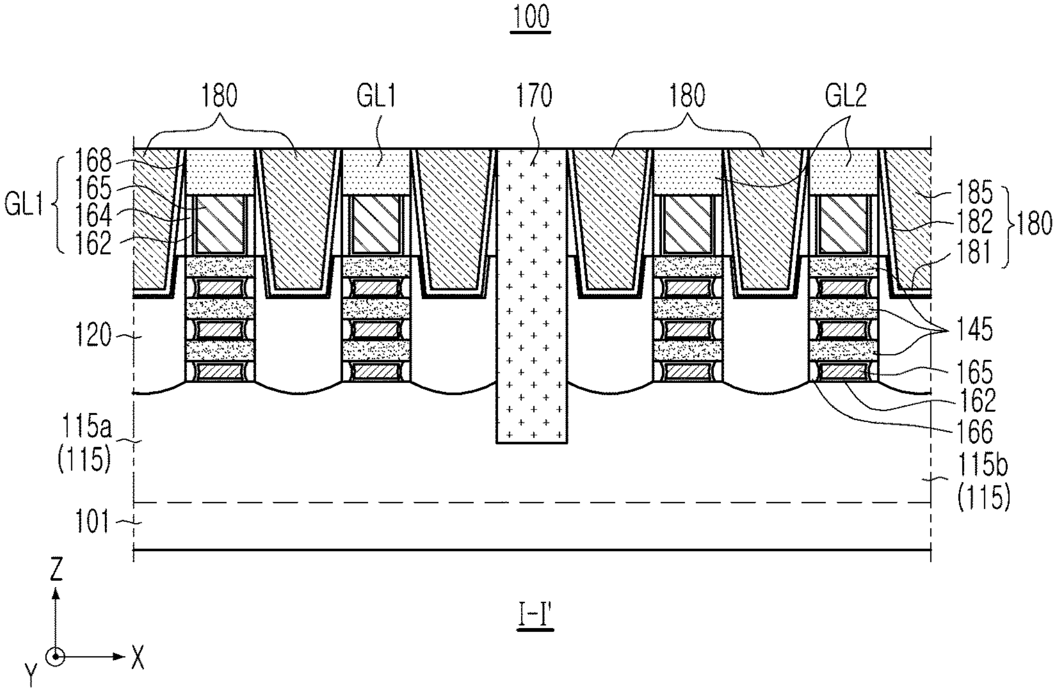
FIG. 2 is a cross-sectional view of the semiconductor device of FIG. 1 taken along line I-I'.
Figure 3A:
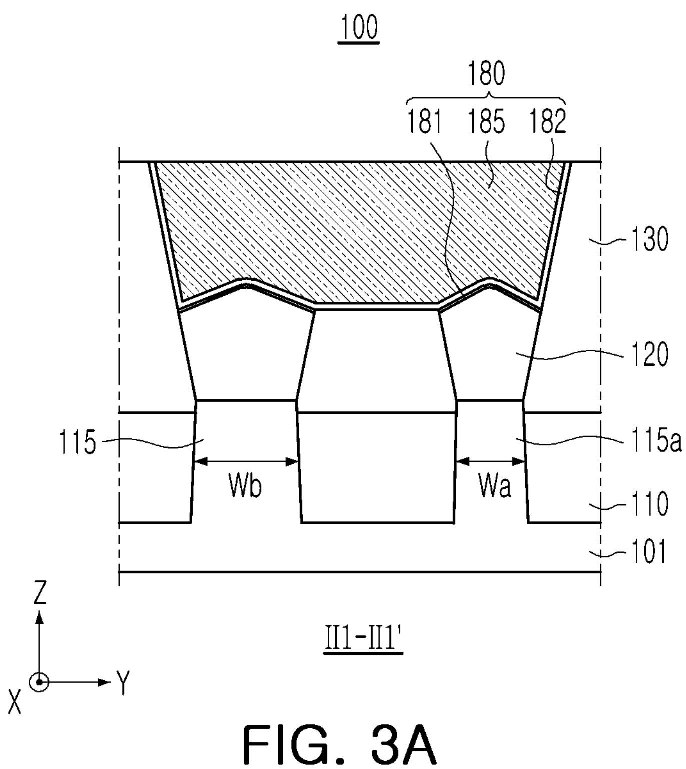
FIG. 3A is a cross-sectional view of the semiconductor device of FIG. 1 taken along line II1-II1'.
Figure 3B:
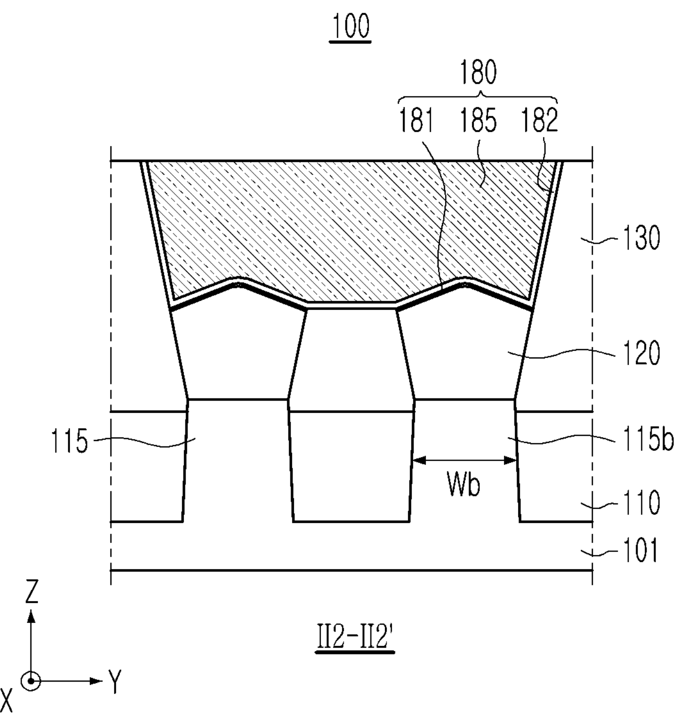
FIG. 3B is a cross-sectional view of the semiconductor device of FIG. 1 taken along line II2-II2'.

FIG. 1 is a plan view illustrating a semiconductor device according to an example embodiment of the present inventive concept, FIG. 2 is a cross-sectional view of the semiconductor device of FIG. 1 taken along line I-I', and FIGS. 3A and 3B are cross-sectional views of the semiconductor device of FIG. 1 taken along lines II1-II1' and II2-II2', respectively.

Referring to FIGS. 1 to 2, a semiconductor device 100 according to the present embodiment may include fin structures (e.g., FS1 and FS2) extending in a first direction (e.g., an X-direction) on a substrate 101, and a plurality of gate lines (e.g., GL1, GL2, and GL3) crossing the fin structures on a substrate 101 and extending in a second direction (e.g., a Y-direction), which may be crossing (e.g., perpendicular to) the first direction.

The substrate 101 may include, for example, a semiconductor material such as Si or Ge, or a compound semiconductor material such as SiGe, SiC, GaAs, InAs, or InP. In another embodiment, the substrate 101 may have a silicon on insulator (SOI) structure.

Each of the fin structures FS1 and FS2 may include an active pattern 115 protruding upwardly from an upper surface of the substrate 101, and a plurality of nanosheets 145 disposed on the active pattern 115 to be spaced apart from each other in a third direction (e.g., a Z-direction), which may be perpendicular to the upper surface of the substrate 101.

As illustrated in FIG. 1, the active pattern 115 may extend in a first direction (e.g., the X-direction) on the substrate 101, and may be arranged side by side with another adjacent active pattern 115 in the second direction (e.g., the Y-direction). The active pattern 115 and the plurality of nanosheets 145 may be provided as a multi-channel region of a transistor. A detailed description of such a multi-channel structure will be described later.

A device isolation film 110 may define an active region including an active pattern 115, and a portion of the active pattern 115 may protrude from an upper surface of the device isolation film 110. For example, the device isolation film 110 may include silicon oxide or a silicon oxide-based insulating material. The device isolation film 110 may include a first isolation region defining an active region without the active pattern 115 and a second isolation region defining the active pattern 115. The first isolation region may have a bottom surface that is deeper than that of the second isolation region. For example, the first isolation region may be referred to as deep trench isolation (DTI), and the second isolation region may be referred to as shallow trench isolation (STI). The second isolation region may be disposed on an active region. The active region defined by the device isolation film 110 may be a conductive region such as a well doped with an impurity or a structure doped with an impurity. For example, the active region may have an N-type well for a PMOS transistor or a P-type well for an NMOS transistor.

In the present embodiment, each of the fin structures may include first and second fin structures FS1 and FS2 extending in a first direction (e.g., the X-direction) and spaced apart from each other in a second direction (e.g., the Y-direction). While a width Wb of the second fin structure FS2 in the second direction (e.g., the Y-direction) is constant (uniform) along the first direction (e.g., the X-direction), in order to realize high integration, the first fin structure FS1 may have portions FS1*a* and FS1*b* having different widths Wa and Wb in the second direction (e.g., the Y-direction).

Specifically, as illustrated in FIG. 1, the first fin structure FS1 may have a first fin portion FS1*a* having a first width Wa and a second fin portion FS1*b* having a second width Wb, greater than the first width Wa. The second fin structure FS2 may have the second width Wb. The second fin structure FS2 may have the same (equal) second width Wb as the second fin portion FS1*b*, but an example embodiment thereof is not limited thereto.

In the present embodiment, the plurality of gate lines may include first to third gate lines GL1, GL2, and GL3 extending in the second direction (e.g., the Y-direction) and spaced apart from each other in the first direction (e.g., the X-direction). As illustrated in FIG. 1, the first gate line GL1 may be disposed to cross the first fin portion FS1*a* and the second fin structure FS2, and the second gate line GL2 may be disposed on the second fin portion FS1*b* and the second fin structure FS2. The third gate line GL3 may be disposed to cross the second fin structure FS2. The third gate line GL3 may be arranged in parallel with the device isolation pattern 170 in the second direction (e.g., the Y-direction). The third gate line GL3 may be overlapped with the device isolation pattern 170 in the first direction (e.g., the X-direction).

A device isolation pattern 170 may extend in the second direction (e.g., the Y-direction) between the first fin portion FS1*a* and the second fin portion FS1*b*, and be connected to one end of the third gate line GL3. As illustrated in FIG. 2, the device isolation pattern 170 may extend in the third direction (e.g., Z-direction) toward the substrate 101 so that the first fin structure FS1 is separated into the first and second fin portions FS1*a* and FS1*b*. The device isolation pattern 170 may have a lower surface lower than a lower surface of source/drain regions 120 (e.g., the source/drain region in first fin structure FS1, adjacent to the device isolation pattern 170). In this embodiment, the device isolation pattern 170 may have a depth extending to at least a portion of the active pattern 115. In some embodiments, the device isolation pattern 170 may be formed to be deeper than the active pattern 115 (see FIG. 14).

The device isolation pattern 170 may remove a portion of a region whose width is changed in the first fin structure FS1. In the present embodiments, the first and second fin portions FS1*a* and FS1*b* may be formed by an etching process using separate mask patterns having different widths. Even if a separate mask is used, a bridge region BR connecting opposite end portions of the first fin portion FS1*a* and the second fin portion FS1*b*, adjacent to each other may be formed (refer to FIG. 4A), and the bridge region BR may be removed in a process of forming the device isolation pattern 170. On the contrary, in some embodiments (e.g., see FIGS. 18 to 20), the width change region of the first fin structure FS1 may be a tapered portion 115T gradually increasing from the first width Wa to the second width Wb, and a portion of the tapered portion may be removed by the device isolation pattern 170.

The device isolation pattern 170 may be formed by removing a portion of the third gate line GL3, crossing the first fin structure FS1 (see FIG. 4C), and filling an isolation hole obtained by removing a portion of the first fin structure FS1 from the removed portion with an insulating material. The device isolation pattern 170 may include, for example, silicon nitride (SiN), silicon oxynitride (SiON), silicon carbonitride (SiCN), or silicon oxycarbonitride (SiOCN), but not limited thereto.

The device isolation pattern 170 may have a width W4 in the first direction, substantially to the same as a width W3 of the third gate line GL3 in the first direction. In some embodiments, in a process of partially removing the third gate line GL3 for the device isolation pattern 170, a region around the isolation hole may be expanded by an additional removing, and the device isolation pattern 170 may have a width W4, rather larger than the width W3 of the third gate line GL3. As described above, the width W4 of the device isolation pattern 170 may be substantially the same as the width W3 of the third gate line GL3 or may be slightly wider than the width W3 of the third gate line GL3 (e.g., 120% or less).

Meanwhile, as in the present embodiment, the device isolation pattern 170 may have a width W4 in which a width change region (e.g., the bridge region BR or the tapered portion 115T) of the first fin structure FS1 is sufficiently removed. Referring to FIG. 1, a width change region does not exist between first and second fin portions FS1*a* and FS1*b*, and each of the first and second fin portions FS1*a* and FS1*b* may have a constant (uniform) width (a first width (Wa) and a second width (Wb)).

According to the present embodiment, one gate line (e.g., a third gate line GL3) may be in the width change region of the first fin structure FS1, and the other gate lines (e.g., GL1 and GL2), adjacent thereto, may be arranged on the first and second fin portions FS1*a* and FS1*b* having a constant (uniform) width (e.g., Wa and Wb). Hereinafter, such an arrangement is referred to as "an arrangement method of gate lines" according to the present embodiment.

According to this "arrangement method of gate lines", the width change region may be removed by a partial cut process of one gate line. In addition, since the first and second gate lines GL1 and GL2 may be in a region in which widths may not substantially change in the first and second fin portions FS1*a* and FS1*b*, respectively, the first and second gate lines GL1 and GL2 may be arranged substantially perpendicular to the first and second fin portions FS1*a* and FS1*b*, respectively.

In contrast thereto, when the first and second gate lines GL1 and GL2 (in particular, the first and second gate lines GL1 and GL2, adjacent to the third gate line GL3) are in the width change region of the first fin structure FS1, the first and second gate lines GL1 and GL2 may be arranged to form an acute angle with a corner of the first fin structure FS1. As a result, the source/drain region 120 (epitaxial region) formed in a region that meets a gate line at an acute angle among the first fin structures FS1 may become thin, and thus an undesired short defect may occur. Such a short defect of the source/drain region 120 can be effectively prevented by using the arrangement method of the gate lines according to the present embodiment.

In some embodiments, the arrangement method of the gate lines may be implemented by changing a pitch P3 between the third gate line GL3 and the first and second gate lines GL1 and GL2, adjacent to the third gate line GL3, and/or a width W3 of the third gate line GL3 (see FIGS. 18B, 19 and 20), but as in the present embodiment, the arrangement method of the gate lines may be implemented without changing the width W3 and the pitch P3 of the third gate line GL3.

Specifically, referring to FIG. 1, the first pitch P1 between the first gate lines GL1 and the second pitch P2 between the second gate lines GL2 may be same as (equal to) each other, and the third pitch P3 between the third gate line GL3 and the first and second gate lines GL1 and GL2, adjacent to the third gate line GL3 may be the same as (equal to) the first and second pitches P1 and P2. Similarly thereto, the first width W1 of the first gate lines GL1 and the second width W2 of the second gate lines GL2 may be same as (equal to) each other, and the third gate line GL3 has a third width W3 that may be same as (equal to) the first and second widths W1 and W2.

The gate lines GL1, GL2, and GL3 in this embodiment may include gate spacers 164, a gate insulating film 162 and a gate electrode 165, sequentially disposed between the gate spacers 164, and a gate capping layer 168 disposed on the gate electrode 165. For example, the gate spacers 164 may include silicon nitride, silicon oxynitride, silicon carbonitride, or silicon oxycarbonitride, but not limited thereto. The gate insulating film 162 may include a silicon oxide film, a silicon nitride film, a silicon oxynitride film, and/or a high-k film, but not limited thereto. The high-k film may include a material having a higher dielectric constant than a silicon oxide film, such as a hafnium oxide film (HfO), an aluminum oxide film (AlO), or a tantalum oxide film (TaO). The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. In some embodiments, the gate electrode 165 may be a multilayer including two or more films. Also, the gate capping layer 168 may include, for example, silicon nitride, silicon oxynitride, silicon carbonitride, or silicon oxycarbonitride, but not limited thereto.

In the present embodiment, as described above, the plurality of nanosheets 145 may be spaced apart from each other in the third direction (e.g., a Z-direction) on the active pattern 115 to constitute a multi-channel region. The gate electrode 165 may extend in the second direction (e.g., a Y-direction) to cross the active pattern 115 while surrounding the plurality of nanosheets 145. The gate electrode 165 may be interposed between the plurality of nanosheets 145 as well as a space between the gate spacers 164.

In the present embodiment, the source/drain regions 120 may be disposed on the active pattern 115 and positioned on both (opposing) sides of the gate lines (e.g., GL1, GL2, and GL3), and may be respectively connected to both (opposing) sides of a plurality of nanosheets 145 in the first direction (e.g., a X-direction). In this embodiment, the number of nanosheets 145 is illustrated as three, but the number of the nanosheets may not be particularly limited. The nanosheets 145 may be formed of semiconductor patterns. For example, the nanosheets 145 may include silicon (Si), silicon germanium (SiGe), and/or germanium (Ge), but not limited thereto.

The source/drain region 120 may be on both (opposing) sides of the gate lines GL1, GL2, and GL3, and may include an epitaxial pattern formed using the recessed surface of the plurality of nanosheets 145 and the active pattern 115 as seeds.

In the present embodiment, forming the source/drain region 120 may include forming a recess in a partial region of the active pattern 115, and performing selective epitaxial growth (SEG) in the recess. The source/drain region 120 may include silicon (Si), silicon germanium (SiGe), and/or germanium (Ge), but not limited thereto, and depending on the type of the semiconductor device (e.g., N-type or P-type), the source/drain region 120 may have a different material or a different shape. For example, in the case of a PMOS transistor, the source/drain region 120 may include silicon-germanium (SiGe), and may be doped with P-type impurities (e.g., boron (B), indium (In), gallium (Ga)). A cross-section (refer to FIGS. 3A and 3B, Y-Z cross-section) of the source/drain region 120 may have a pentagonal shape. On the other hand, in the case of an NMOS transistor, the source/drain region 120 may include silicon (Si), and may be doped with N-type impurities (e.g., phosphorus (P), nitrogen (N), arsenic (As), antimony (Sb)). A cross-section (Y-Z cross-section) of the source/drain region 120 may have a hexagonal shape or a polygonal shape having a gentle angle. In addition, the source/drain regions 120 in this embodiment may include a plurality of epitaxial layers having different compositions and/or impurity concentrations (refer to FIG. 10A).

Inner spacers 166 may be provided between each of the source/drain regions 120 and the gate electrode 165. The inner spacers 166 may be on both (opposing) sides of the gate electrode 165 interposed between the plurality of nanosheets 145 in the first direction (e.g., the X-direction). The plurality of nanosheets 145 may be respectively connected to the source/drain regions 120 on both (opposing) sides thereof, and the gate electrode 165 interposed between the plurality of nanosheets 145 may be insulated from the source/drain regions 120 on both (opposing) sides thereof by the internal spacers 166. The gate insulating film 162 may be interposed between each of the gate electrode 165 and the nanosheet 145, and may also extend between the gate electrode 165 and the inner spacers 166.

As described above, the semiconductor device 100 according to the present embodiment may constitute a gate-all-around type field effect transistor.

In the semiconductor device 100 according to the present embodiment, an interlayer insulating layer 130 may be disposed on the device isolation film 110. The interlayer insulating layer 130 may be disposed around gate lines GL1, GL2, and GL3. Referring to FIGS. 1 and 2, the interlayer insulating layer 130 may be disposed between the first to third gate lines GL1, GL2, and GL3 in the first direction (e.g., the X-direction), and may be referred to as an inter-gate insulating portion. For example, the interlayer insulating layer 130 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof, but not limited thereto. The interlayer insulating layer 130 may be formed using a chemical vapor deposition (CVD) process, a flowable-CVD process, or a spin coating process, but not limited thereto.

A contact structure 180 in this embodiment may extend through the interlayer insulating layer 130, and may be respectively connected to the source/drain regions 120. As illustrated in FIGS. 2 and 3A and 3B, the contact structure 180 may include a metal silicide layer 181, a conductive barrier 182, and a contact plug 185 The conductive barrier 182 may be on (e.g., cover) side surfaces and a lower surface of the contact plug 185. The metal silicide layer 181 may be disposed between the conductive barrier 182 and the source/drain regions 120. For example, the conductive barrier 182 may include Ta, TaN, Mn, MnN, WN, Ti, and/or TiN. The metal silicide layer 181 may include CoSi, NiSi, and/or TiSi. The contact plug 185 may include tungsten (W), cobalt (Co), titanium (Ti), an alloy thereof, or a combination thereof. The compositions of the conductive barrier 182, the metal silicide layer 182, and the contact plug 185 above may be exemplary embodiments and may not be limited thereto. In addition, the semiconductor device 100 according to the present embodiment may include an interconnection structure (not shown) connected to the contact structure 180 on the interlayer insulating layer 130. The interconnection structure may include dielectric layers disposed on the interlayer insulating layer 130 and interconnection lines electrically connected to the contact structure 180 in each of the dielectric layers.

As described above, the semiconductor device 100 according to the present embodiment may include a single fin structure having fin portions with different widths in order to implement devices having different functions in high density. In addition, the present embodiment may provide a method of introducing a new arrangement of gate lines and removal of a width changing portion using a partial cut process of the gate line in order to solve the problem caused by the width changing portion of the fin structure. A method of manufacturing such a semiconductor device will be described in detail with reference to FIGS. 4 to 13.

Figure 4A:
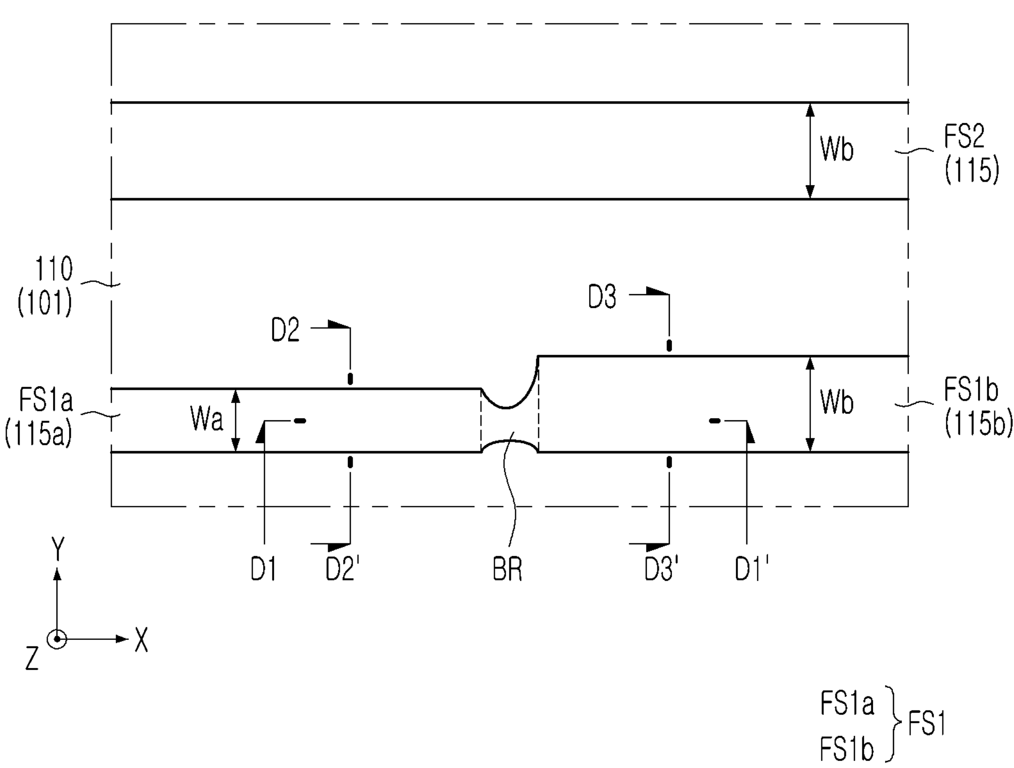
FIG. 4A is a plan view of sacrificial layers and nanosheets stacked on a substrate in an alternating pattern, illustrating the method of manufacturing the semiconductor device of FIG. 1.
Figure 4B:
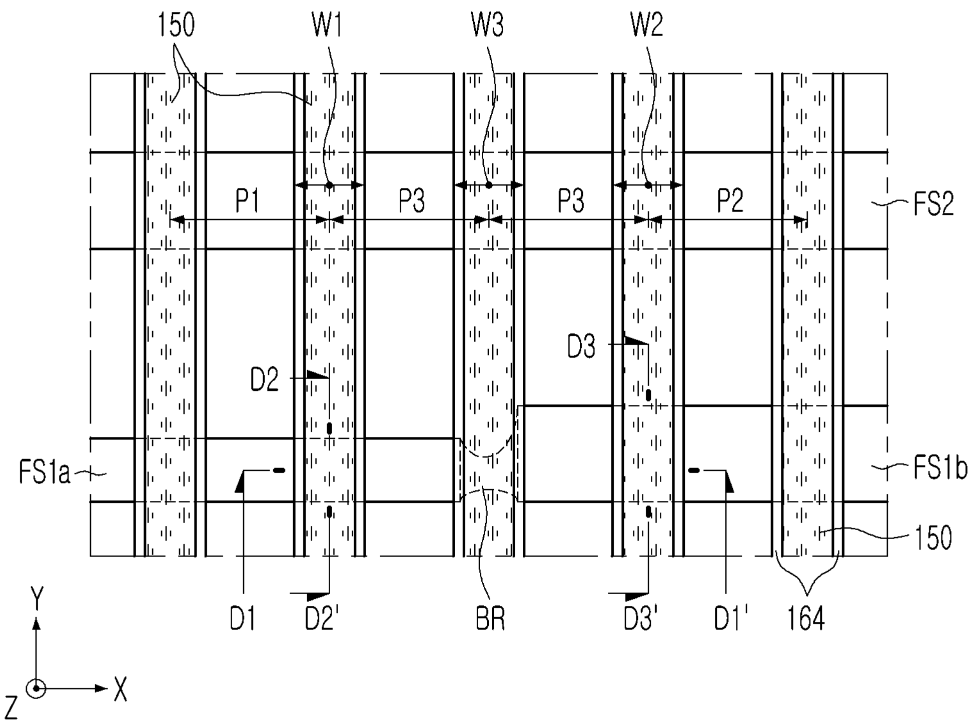
FIG. 4B is a plan view of an arrangement of line-shaped sacrificial gate structures, illustrating the method of manufacturing the semiconductor device of FIG. 1.
Figure 4C:
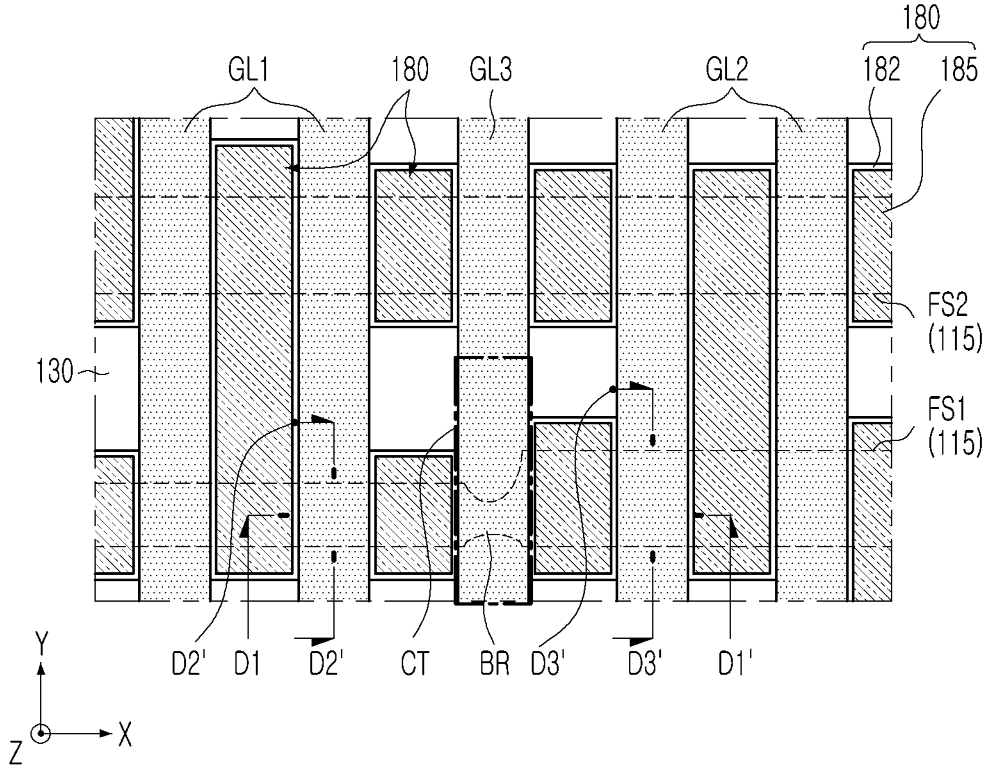
FIG. 4C is a plan view of a contact plug connected to the source/drain region, illustrating the method of manufacturing the semiconductor device of FIG. 1.

FIGS. 4A to 4C are plan views for each main process, illustrating the method of manufacturing the semiconductor device of FIG. 1, respectively, and FIGS. 5A to 13A are cross-sectional views D1-D1' for each main process, illustrating the method for manufacturing the semiconductor device of FIG. 1, respectively, and FIGS. 5B to 13B are cross-sectional views D2-D2' and D3-D3' for each main process, illustrating the method of manufacturing the semiconductor device of FIG. 1, respectively.

Figure 5A:
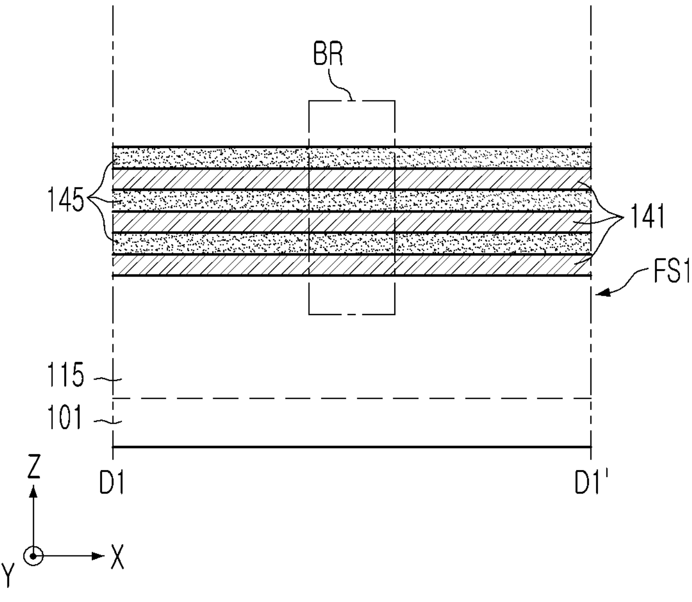
FIG. 5A shows a cross-sectional view along line D1-D1' of sacrificial layers and nanosheets stacked on a substrate in an alternating pattern, in accordance with a method of manufacturing the semiconductor device of FIG. 1.
Figure 5B:
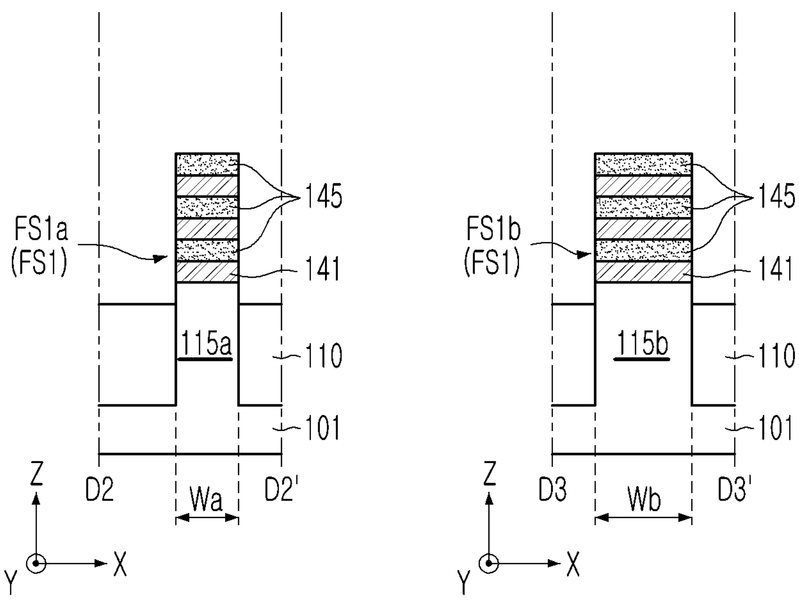
FIG. 5B shows cross-sectional views along lines D2-D2' and D3-D3' of sacrificial layers and nanosheets stacked on a substrate in an alternating pattern, in accordance with a method of manufacturing the semiconductor device of FIG. 1.

First, referring to FIGS. 4A, 5A and 5B, sacrificial layers 141 and nanosheets 145 may be alternately stacked on a substrate 101, and a stack structure of the sacrificial layers 141 and nanosheets 145 and a portion of the substrate 101 may be removed so that first and second fin structures FS1 and FS2 may be formed.

The sacrificial layers 141 may be removed in a subsequent process to provide a space for the gate insulating film 162 and the gate electrode 165 shown in FIG. 2. The nanosheets 145 may include a material for forming a channel of a transistor. The nanosheets 145 may include, for example, a semiconductor material such as silicon (Si), silicon germanium (SiGe), and/or germanium (Ge). The nanosheets 145 may include impurities, but example embodiments thereof are not limited thereto. The sacrificial layers 141 may include a material having etch selectivity with respect to the nanosheets 145.

In some embodiments, for example, the sacrificial layers 141 may include silicon germanium (SiGe), and the nanosheets 145 may include silicon (Si). Each of the sacrificial layers 141 and the nanosheets 145 may have a thickness in a range of about 1 Å to 100 nm. In some embodiments, the number of layers of the channel layers (e.g., the nanosheets 145), alternately stacked with the sacrificial layer 141 may be variously changed.

Next, first and second fin structures FS1 and FS2 may be formed by removing a stack structure of the sacrificial layers 141 and the nanosheets 145 and a portion of the substrate 101. Each of the first and second fin structures FS1 and FS2 may include sacrificial layers 141 and nanosheets 145 alternately stacked to each other. In this process, a portion of the substrate 101 may be removed to further include an active pattern 115 protruding from an upper surface of the substrate 101. The first and second fin structures FS1 and FS2 may be formed in a line shape extending in a first direction (e.g., the X-direction), and may be arranged to be spaced apart from each other in a second direction (e.g., the Y-direction).

The second fin structure FS2 may have a width Wb in the second direction. The width Wb is constant (uniform) along the first direction. Meanwhile the first fin structure FS1 may have a first fin portion FS1*a* having a first width Wa in the second direction and a second fin portion FS1*b* having a second width Wb, greater than the first width Wa. In this embodiment, the first and second fin portions FS1*a* and FS1*b* may be etched using separate mask patterns having different widths, respectively. Even when a separate mask is used, a bridge region BR connecting opposite end portions of the first fin portion FS1*a* and the second fin portion FS1*b*, adjacent thereto, may be formed. The bridge region BR may be a portion of the thin stack structure that is not etched between the first fin portion FS1*a* and the second fin portion FS1*b*.

After an insulating material layer is formed so that the first and second fin structures FS1 and FS2 are buried in a region from which a portion of the substrate 101 is removed, a device isolation film 110 may be formed by recessing the insulating material layer so that a portion of the active pattern 115 protrudes.

Figure 6A:
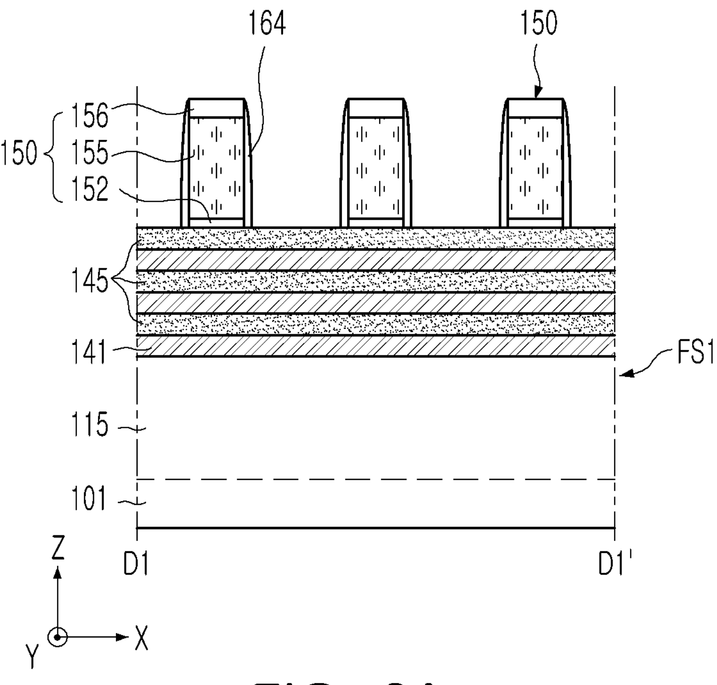
FIG. 6A shows a cross-sectional view along line D1-D1' of sacrificial gate structures and gate spacers formed on first and second fin structures, in accordance with a method of manufacturing the semiconductor device of FIG. 1.
Figure 6B:
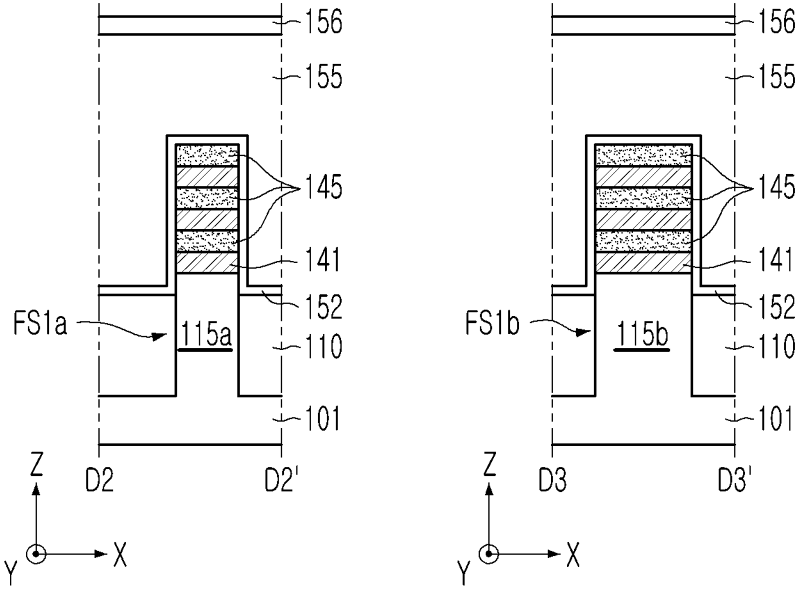
FIG. 6B shows cross-sectional views along lines D2-D2' and D3-D3' of sacrificial gate structures and gate spacers formed on first and second fin structures, in accordance with a method of manufacturing the semiconductor device of FIG. 1.

Next, referring to FIGS. 6A and 6B, sacrificial gate structures 150 and gate spacers 164 may be formed on first and second fin structures FS1 and FS2.

The sacrificial gate structures 150 may be sacrificial structures defining gate lines GL1, GL2, and GL3 to be formed in a subsequent process. The sacrificial gate structures 150 may have a line shape crossing the first and second fin structures FS1 and FS2 and extending in the second direction (e.g., the Y-direction), and may be arranged to be spaced apart from each other in the first direction (e.g., the X-direction). The sacrificial gate structure 150 may include first and second sacrificial gate layers 152 and 155 and a mask pattern layer 156 that are sequentially stacked.

The first and second sacrificial gate layers 152 and 155 may be patterned using a mask pattern layer 156. The first and second sacrificial gate layers 152 and 155 may be an insulating layer and a conductive layer, respectively, but example embodiments thereof are not limited thereto, and the first and second sacrificial gate layers 152 and 155 may be formed of a single layer. In some embodiments, the first sacrificial gate layer 152 may include silicon oxide, and the second sacrificial gate layer 155 may include polysilicon. The mask pattern layer 156 may include silicon oxide and/or silicon nitride.

Gate spacers 164 may be formed on both (opposing) sidewalls of the sacrificial gate structures 150. The gate spacers 164 may be formed by forming a film having a uniform thickness along upper and side surfaces of the sacrificial gate structures 150 and the active structures, and then performing anisotropic etching. The gate spacers 164 may be formed of a low-k material, and may include, for example, SiO, SiN, SiCN, SiOC, SiON, and/or SiOCN, but not limited thereto.

Referring to FIG. 4B, an arrangement of line-shaped sacrificial gate structures 150 is illustrated, which defines a layout of the gate lines GL1, GL2, and GL3 in subsequent processes. One sacrificial gate structure 150 may be disposed on a width change region of the first fin structure FS1, that is, a bridge region BR, and the other sacrificial gate structures 150, adjacent thereto may deviate from the bridge region BR, and may be arranged to be positioned on first and second fin portions FS1*a* and FS1*b* having a constant (uniform) width.

In the present embodiment, the above-described arrangement may be implemented without changing a width and/or pitch of the sacrificial gate structure 150. Specifically, referring to FIG. 4B, the sacrificial gate structures 150 may have the same width (W1=W2=W3), and the sacrificial gate structures 150 may be arranged at the same pitch (P1=P2=P3). In the present embodiment, since the width of the bridge region BR in the first direction may not be large, all of the bridge region BR may be covered by the sacrificial gate structure 150.

Figure 18A:
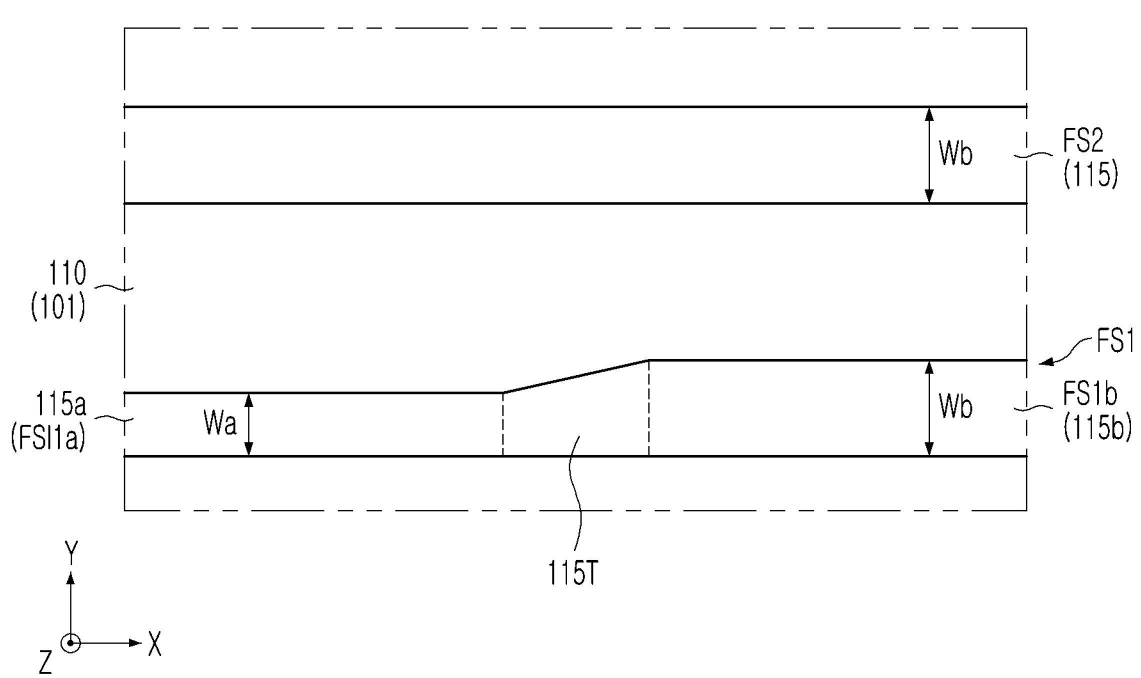
FIG. 18A is a plan view of first and second fin structures on a substrate, illustrating the method of manufacturing the semiconductor device of FIG. 17.
Figure 18B:
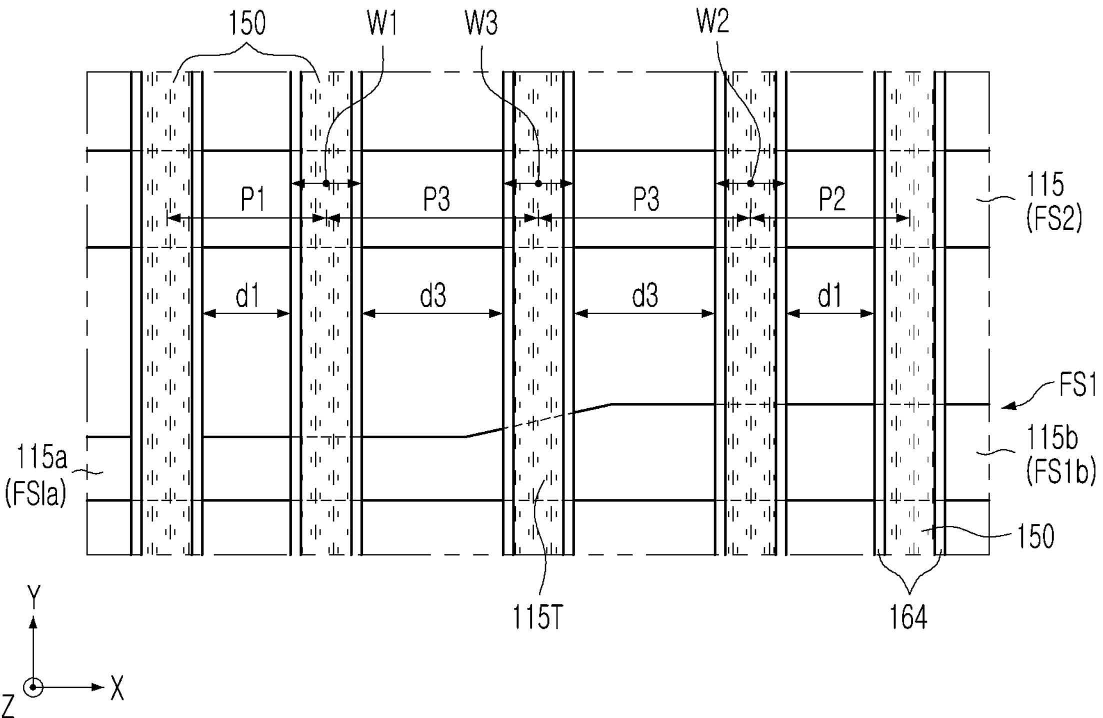
FIG. 18B is a plan view of line-shaped sacrificial gate structures corresponding to the gate lines GL1, GL2, and GL3, illustrating the method of manufacturing the semiconductor device of FIG. 17.
Figure 19:
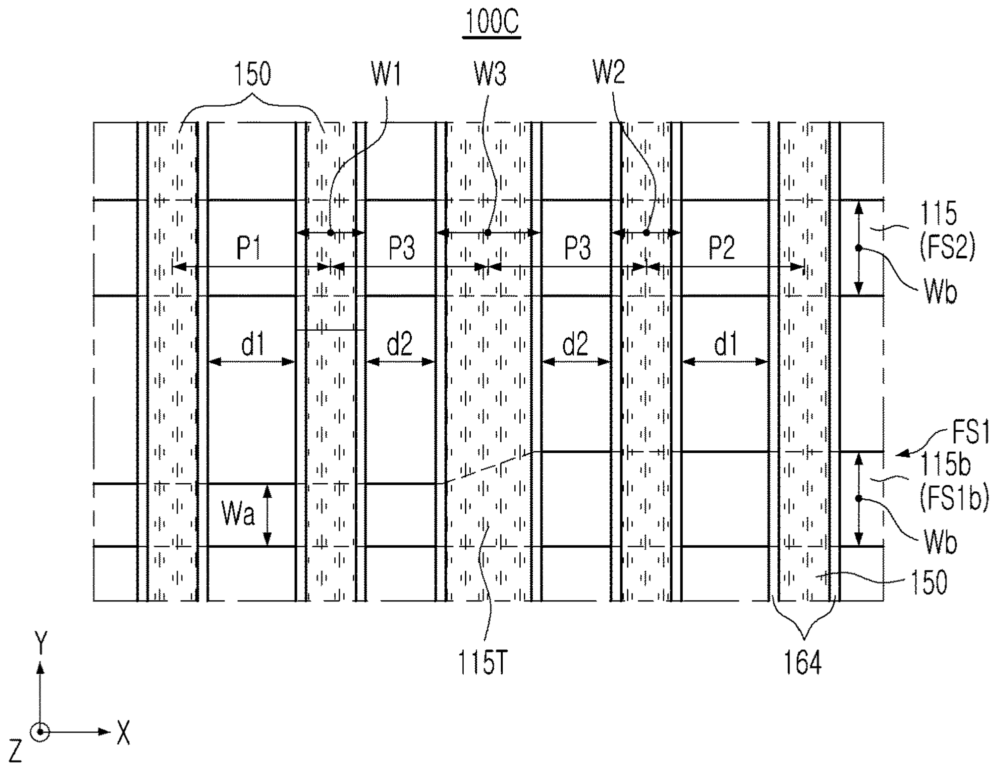
FIGS. 19 and 20 are plan views illustrating semiconductor devices according to various embodiments of the present inventive concept.
Figure 20:
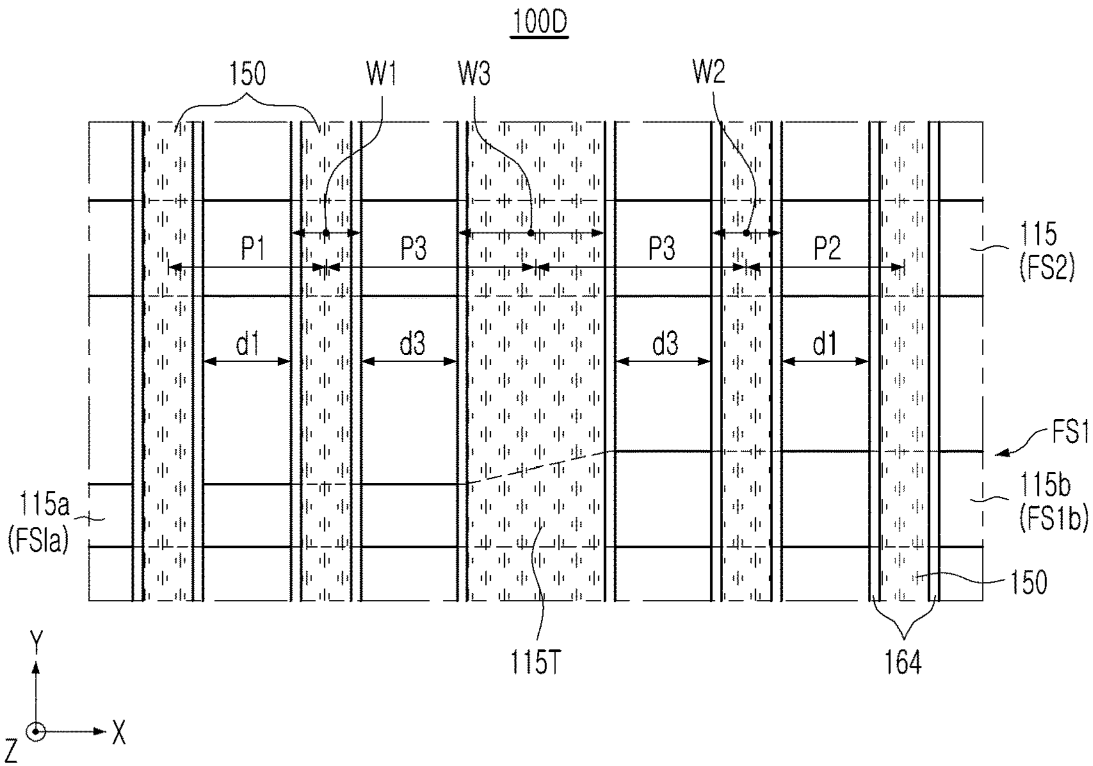

In some embodiments, when the width of the bridge region BR is large, only the width W3 of the sacrificial gate structure 150 to be positioned in the bridge region BR may be increased or the pitch P3 (or distance) of the sacrificial gate structure 150, adjacent thereto, may be increased (e.g., see FIGS. 18B, 19 and 20).

Figure 7A:
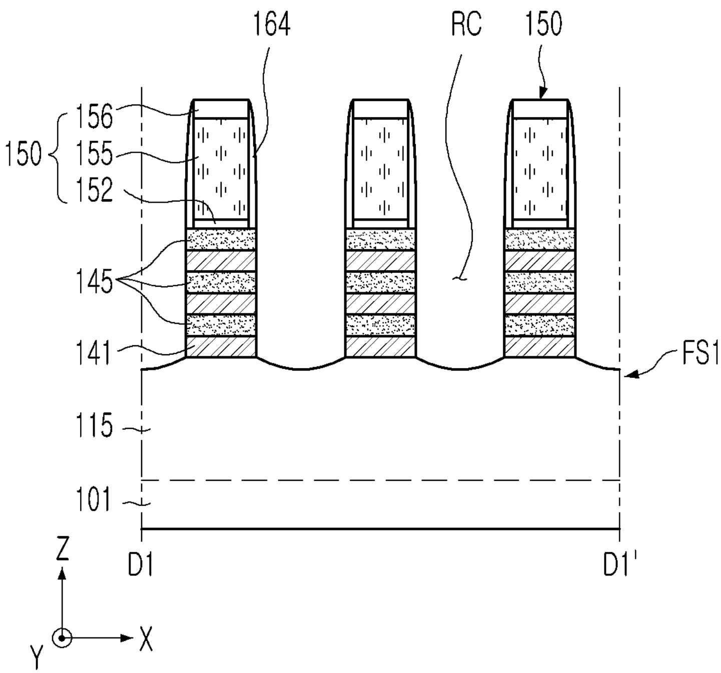
FIG. 7A shows a cross-sectional view along line D1-D1' of a recess formed between sacrificial gate structures, in accordance with a method of manufacturing the semiconductor device of FIG. 1.
Figure 7B:
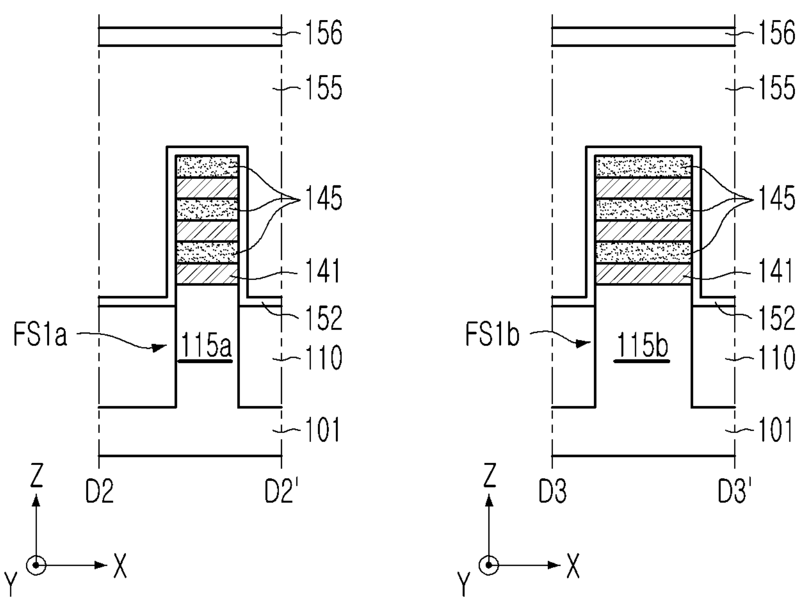
FIG. 7B shows cross-sectional views along lines D2-D2' and D3-D3' of a recess formed between sacrificial gate structures, in accordance with a method of manufacturing the semiconductor device of FIG. 1.

Next, referring to FIGS. 7A and 7B, desired channel structures may be formed by removing the exposed sacrificial layers 141 and nanosheets 145 to form a recess RC between sacrificial gate structures 150.

The exposed sacrificial layers 141 and the nanosheets 145 may be removed by using the sacrificial gate structures 150 and the gate spacers 164 as masks. Through this process, the nanosheets 145 may have a limited length in the first direction (e.g., a X-direction). Below the sacrificial gate structures 150, the sacrificial layers 141 and the nanosheets 145 may be partially removed from side surfaces thereof so that both (opposing) side surfaces in the first direction (e.g., the X-direction) may be located below the sacrificial gate structures 150 and the gate spacer layers 164.

Figure 8A:
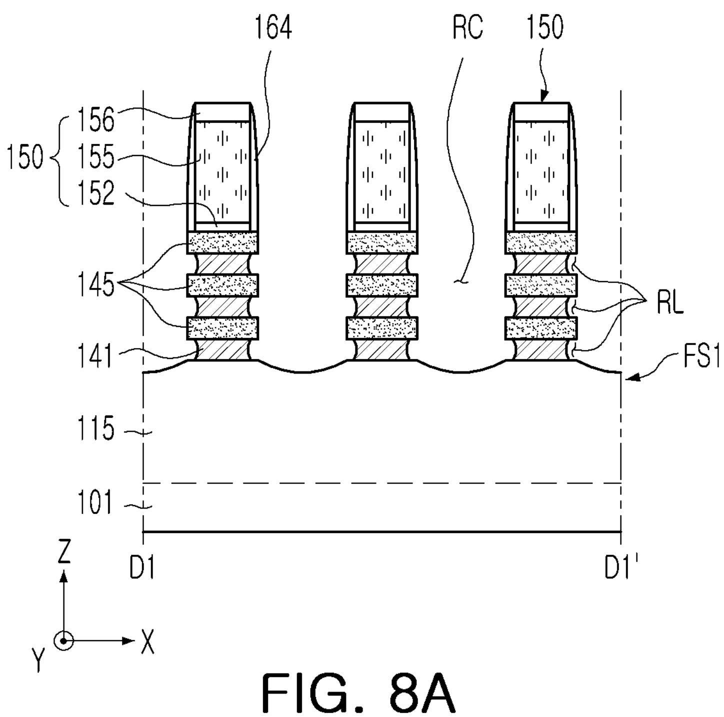
FIG. 8A shows a cross-sectional view along line D1-D1' of portions of the sacrificial layers exposed from a sidewall of the recess, in accordance with a method of manufacturing the semiconductor device of FIG. 1.
Figure 8B:
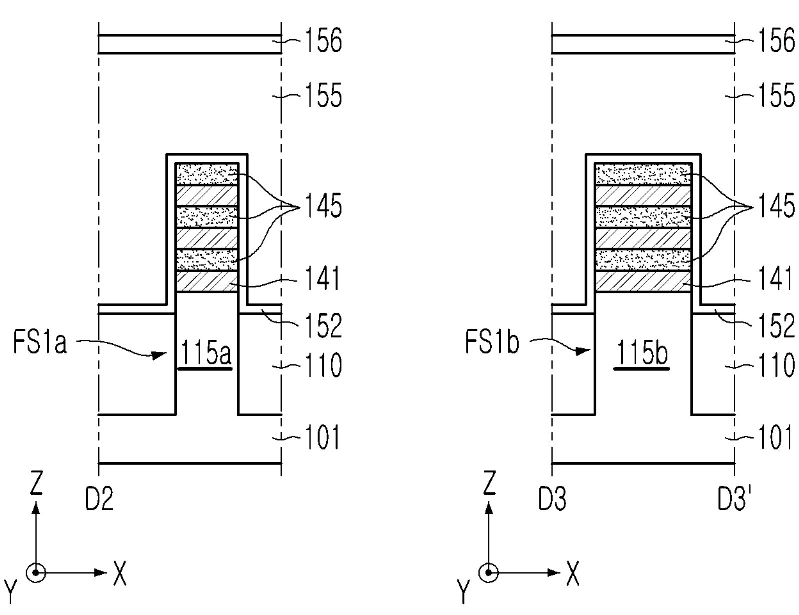
FIG. 8B shows cross-sectional views along lines D2-D2' and D3-D3' of portions of the sacrificial layers exposed from a sidewall of the recess, in accordance with a method of manufacturing the semiconductor device of FIG. 1.

Next, referring to FIGS. 8A and 8B, a portion of the sacrificial layers 141 exposed from a sidewall of the recess RC may be removed.

The sacrificial layers 141 may be selectively etched with respect to the nanosheets 145 by, for example, a wet etching process, and removed to a predetermined depth from the side surface in the first direction (e.g., the X-direction). The sacrificial layers 141 may have inwardly concave side surfaces RL by side etching as described above. However, the shape of the side surface of the sacrificial layers 141 is not limited to the illustrated one.

Figure 9A:
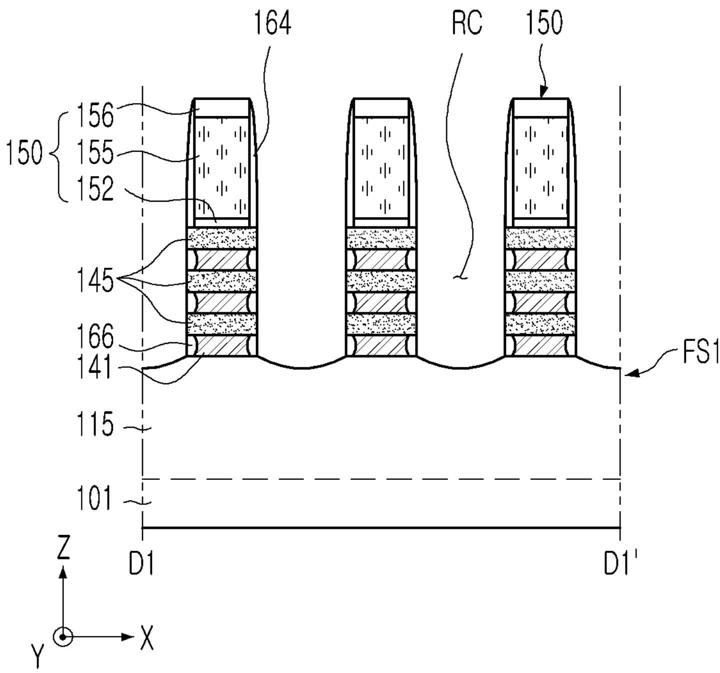
FIG. 9A shows a cross-sectional view along line D1-D1' of inner spacers formed in a region from which sacrificial layers are removed, in accordance with a method of manufacturing the semiconductor device of FIG. 1.
Figure 9B:
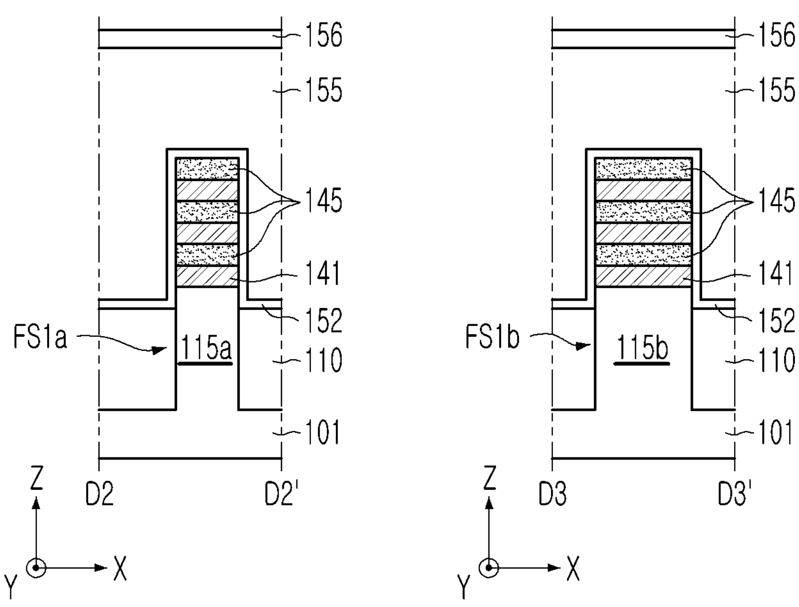
FIG. 9B shows cross-sectional views along lines D2-D2' and D3-D3' of inner spacers formed in a region from which sacrificial layers are removed, in accordance with a method of manufacturing the semiconductor device of FIG. 1.

Next, referring to FIGS. 9A and 9B, inner spacers 166 may be formed in a region from which sacrificial layers 141 are removed (e.g., the inwardly concave side surfaces RL).

The inner spacers 166 may be formed by filling an insulating material in the region from which the sacrificial layers 141 are removed and removing the insulating material deposited on an outside (e.g., side surfaces) of the nanosheets 145. The inner spacers 166 may be formed of the same material as gate spacers 164, but an example embodiment thereof is not limited thereto. For example, the inner spacers 166 may include SiN, SiCN, SiOCN, SiBCN, and/or SiBN.

Figure 10A:
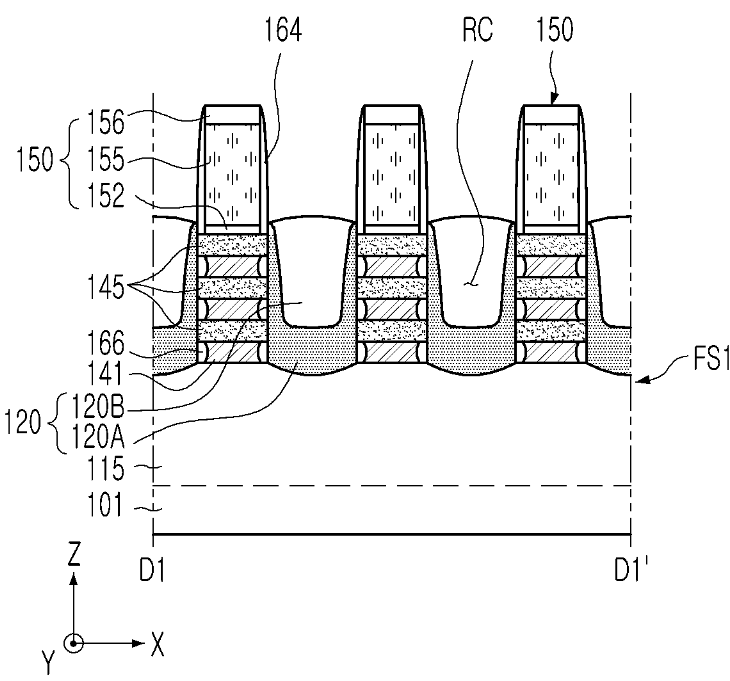
FIG. 10A shows a cross-sectional view along line D1-D1' of source/drain regions formed in a recesses located on both sides of the sacrificial gate structures, in accordance with a method of manufacturing the semiconductor device of FIG. 1.
Figure 10B:
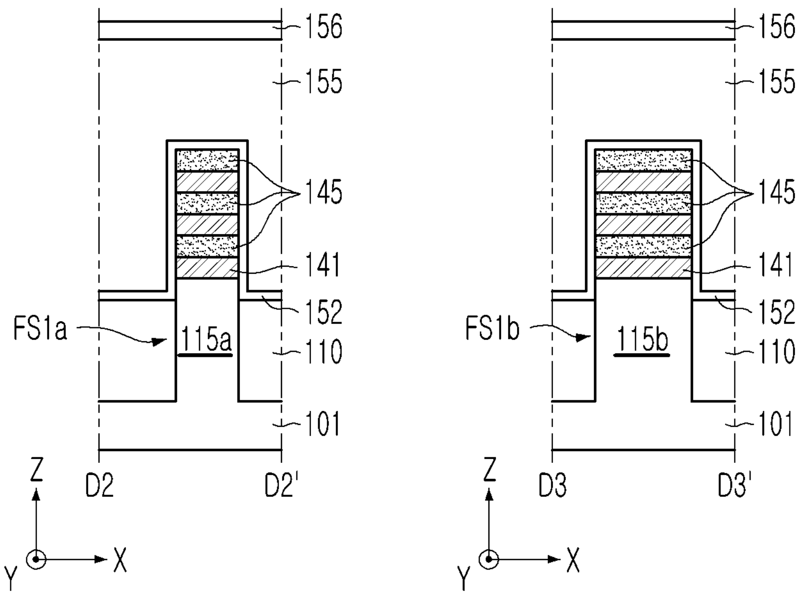
FIG. 10B shows cross-sectional views along lines D2-D2' and D3-D3' of source/drain regions formed in a recesses located on both sides of the sacrificial gate structures, in accordance with a method of manufacturing the semiconductor device of FIG. 1.

Next, referring to FIGS. 10A and 10B, source/drain regions 120 may be formed in the recesses RC located on both (opposing) sides of the sacrificial gate structures 150.

The source/drain regions 120 may include a first epitaxial layer 120A and a second epitaxial layer 120B, respectively. The first epitaxial layer 120A may include a composition and/or impurity concentration, different from that of the second epitaxial layer 120B.

Figure 11A:
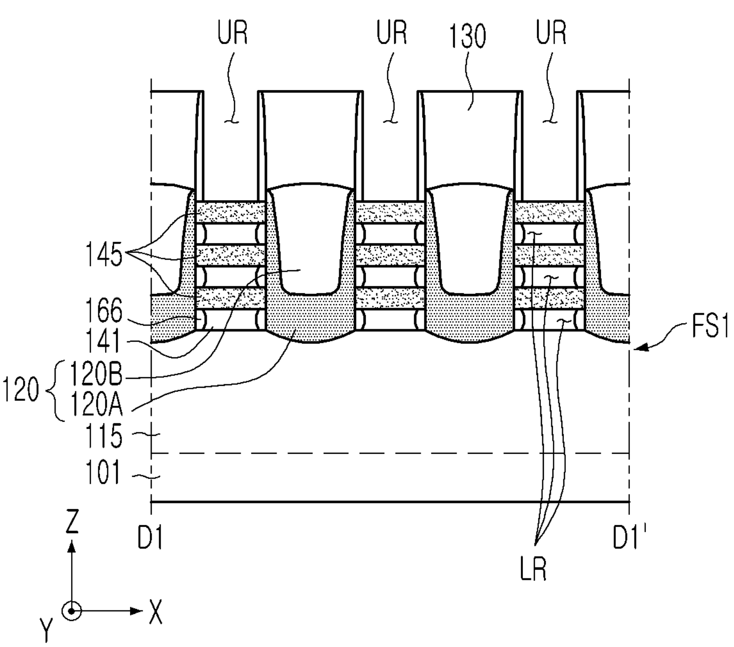
FIG. 11A shows a cross-sectional view along line D1-D1' of upper gap regions and lower gap regions, in accordance with a method of manufacturing the semiconductor device of FIG. 1.
Figure 11B:
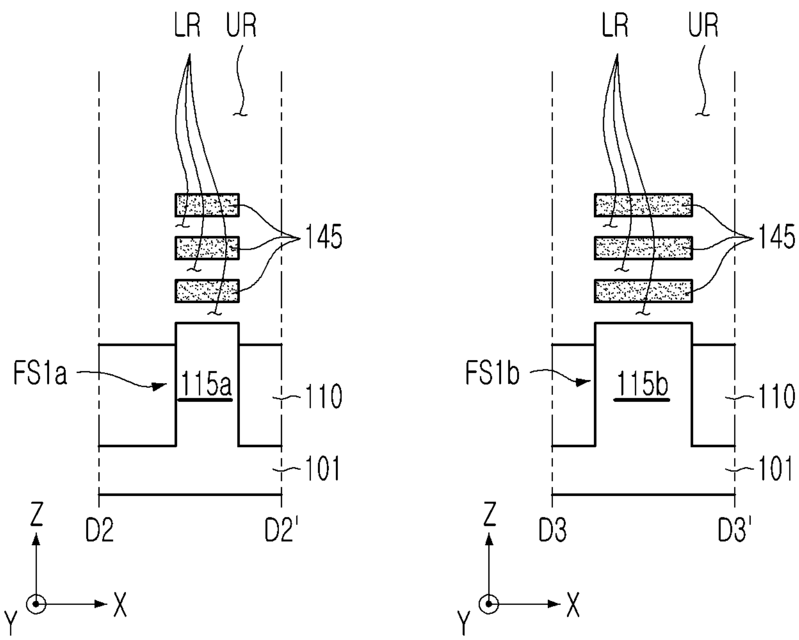
FIG. 11B shows cross-sectional views along lines D2-D2' and D3-D3' of upper gap regions and lower gap regions, in accordance with a method of manufacturing the semiconductor device of FIG. 1.

Next, referring to FIGS. 11A and 11B, an interlayer insulating layer 130 may be formed and sacrificial layers 141 and sacrificial gate structures 150 may be removed to form upper gap regions UR and lower gap regions LR.

The interlayer insulating layer 130 may be formed by forming an insulating film on (e.g., covering) the sacrificial gate structures 150 and the source/drain regions 120 and performing a planarization process. The sacrificial layers 141 and the sacrificial gate structure 150 may be selectively removed with respect to the gate spacers 164, the interlayer insulating layer 130, and the nanosheets 145. First, the upper gap regions UR may be formed by removing the sacrificial gate structures 150, and then the sacrificial layers 141 exposed through the upper gap regions UR may be removed to form the lower gap regions LR. For example, when the sacrificial layers 141 include silicon germanium (SiGe) and the nanosheets 145 include silicon (Si), the sacrificial layers 141 may be selectively removed by performing a wet etching process using peracetic acid as an etchant.

Figure 12A:
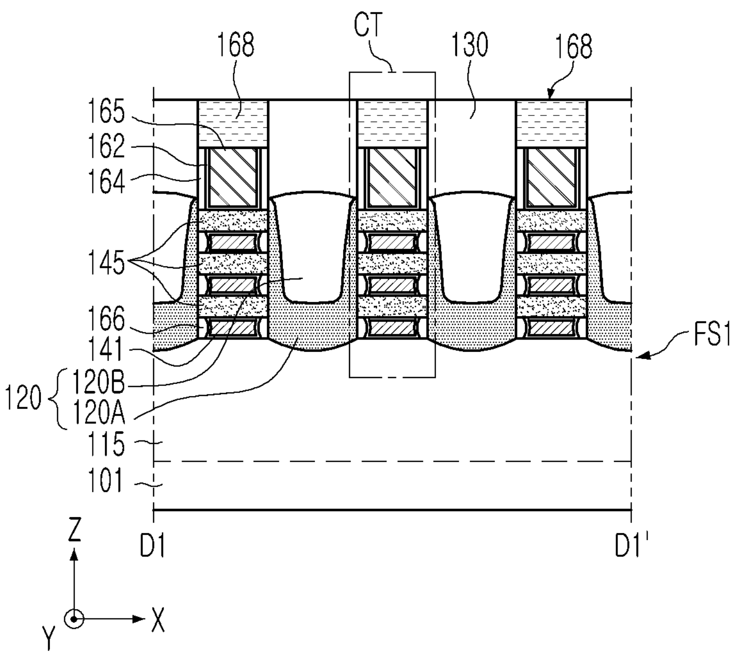
FIG. 12A shows a cross-sectional view along line D1-D1' of the contact structure, in accordance with a method of manufacturing the semiconductor device of FIG. 1.
Figure 12B:
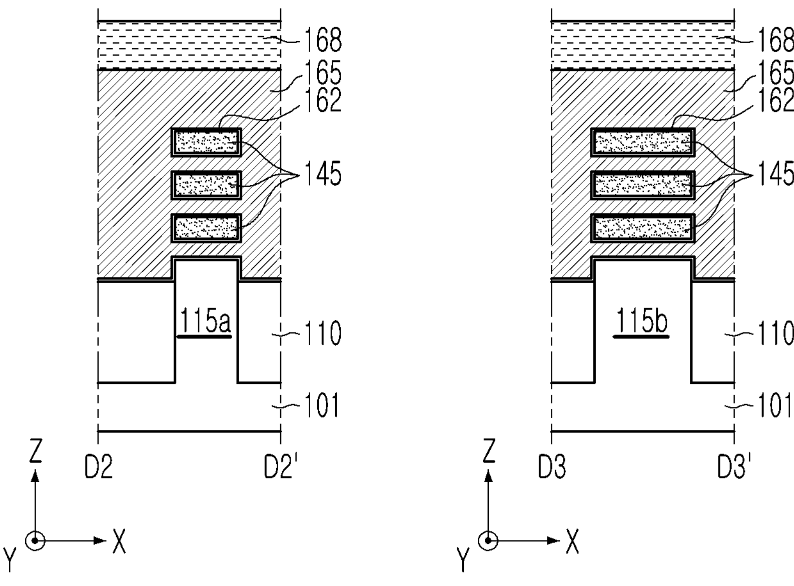
FIG. 12B shows cross-sectional views along lines D2-D2' and D3-D3' of the contact structure, in accordance with a method of manufacturing the semiconductor device of FIG. 1.

Next, referring to FIGS. 12A and 12B, first to third gate lines GL1, GL2, and GL3 may be formed in upper gap regions UR and lower gap regions LR.

The gate insulating film 162 may be formed to conformally cover inner surfaces of the upper gap regions UR and the lower gap regions LR. After the gate electrode 165 is formed to completely fill the upper gap regions UR and the lower gap regions LR, the gate electrode 165 may be removed from an upper portion of the upper gap regions UR to a predetermined depth. A gate capping layer 168 may be formed in a region in which the gate electrode 165 is removed from the upper gap regions UR. Accordingly, the first to third gate lines GL1, GL2, and GL3 including the gate insulating film 162, the gate electrode 165, the gate spacers 164, and the gate capping layer 168 may be formed.

Next, as illustrated in FIG. 4C, a contact structure (e.g., contact plug) 180 connected to the source/drain region 120 may be formed through the interlayer insulating layer 130. Specifically, a contact hole connected to the source/drain region 120 may be formed to penetrate through the interlayer insulating layer 130, and a conductive material may be filled in the contact hole to form the contact structure 180.

Additionally, a bridge region BR, which is a width change region of the first fin structure FS1, may be removed through a partial cut process of the third gate line GL3 for the region marked “CT”. In the arrangement of the gate lines GL1, GL2, and GL3 according to the present embodiment, the bridge region BR may be removed by a partial cut process for one gate line (e.g., the third gate line GL3).

The partial cut process may include removing the region CT of the third gate line GL3 that crosses the first fin structure FS1 and filling an isolation hole that is obtained by removing the region CT of the third gate line GL3 with an insulating material. The insulating material for the filling may include, for example, silicon nitride (SiN), silicon oxynitride (SiON), silicon carbonitride (SiCN), or silicon oxycarbonitride (SiOCN). This partial cut process may be performed at an appropriate stage in the series of processes described above. For example, the partial cut process may be performed before forming the contact structure 180 (see FIG. 12A) or after forming the contact structure 180 (see FIG. 4C). In some embodiments, the partial cut process for removing the bridge region BR may be applied as a partial cut process for the sacrificial dummy gate structure 150.

Figure 13:
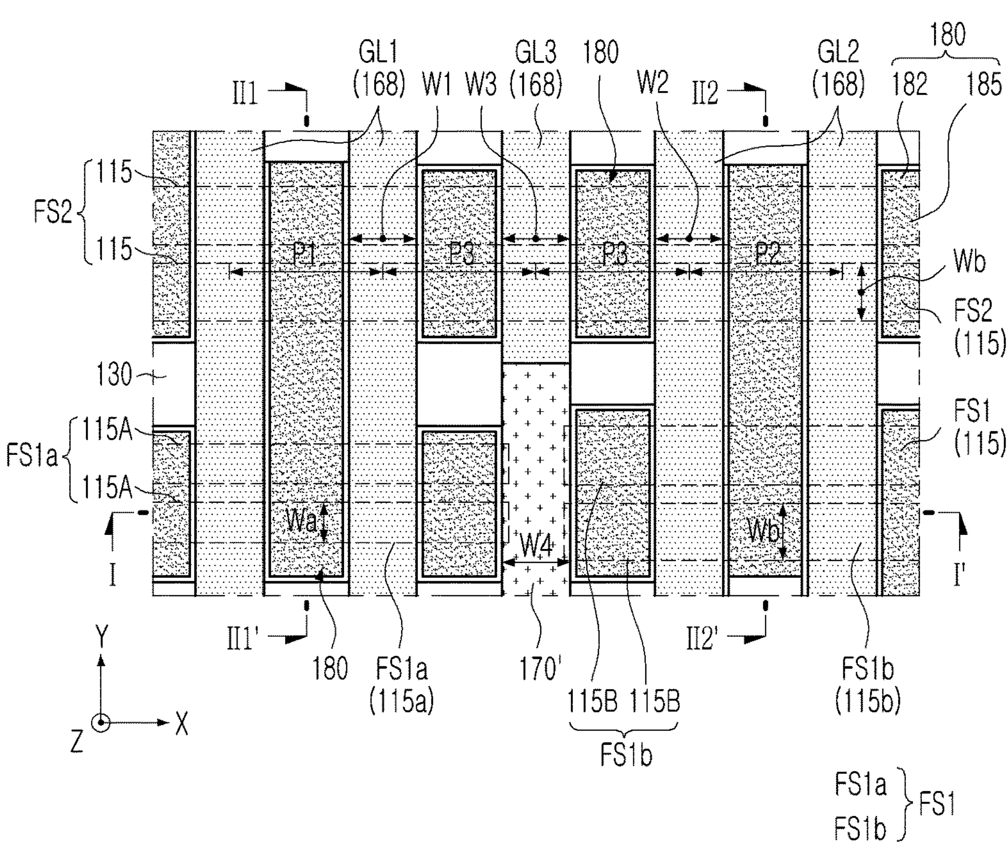
FIG. 13 is a plan view illustrating a semiconductor device according to an example embodiment.
Figure 14:
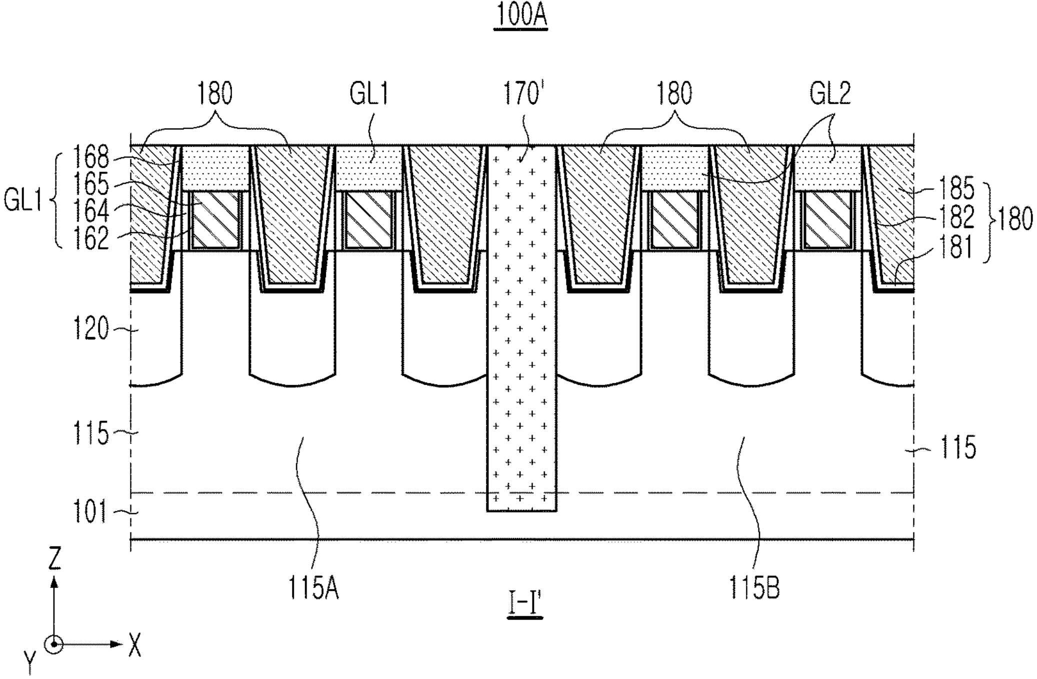
FIG. 14 is a cross-sectional view of the semiconductor device of FIG. 13 taken along line I-I'.
Figure 15A:
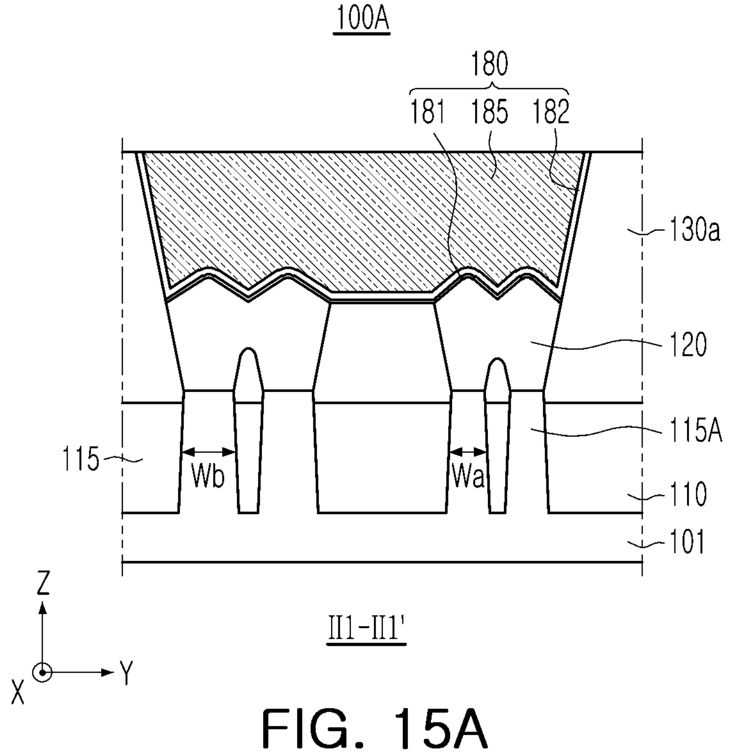
FIG. 15A is a cross-section view of the semiconductor device of FIG. 13 taken along line II1-II1'.
Figure 15B:
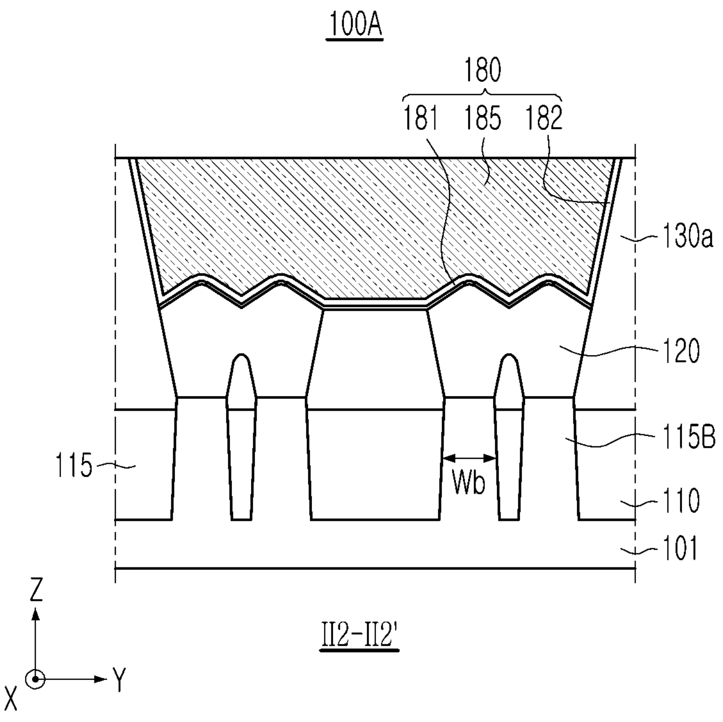
FIG. 15B is a cross-section view of the semiconductor device of FIG. 13 taken along line II2-II2'.

FIG. 13 is a plan view illustrating a semiconductor device 100A according to an example embodiment of the present inventive concept, FIG. 14 is a cross-sectional view of the semiconductor device 100A of FIG. 13 taken along line I-I', and FIGS. 15A and 15B are cross-sectional views of the semiconductor device of FIG. 13 taken along lines II1-II1' and II2-II2', respectively.

Referring to FIGS. 13 and 14, the semiconductor device 100A according to the present embodiment may be similar to the semiconductor device 100 illustrated in FIGS. 1 to 3B, except that fin structures FS1 and FS2 may include a portion of the active pattern 115 as an active fin. The portion of the active pattern 115 is referred to as active fins 115 hereinafter. In addition, the components of the present embodiment may be understood with reference to descriptions of the same or similar components of the semiconductor device 100 illustrated in FIGS. 1 to 3B unless otherwise specified.

Unlike those in the previous embodiment, the fin structures FS1 and FS2 in this embodiment may include active fins 115 provided in a three-dimensional channel structure. Each of the active fins 115 may have a structure protruding upwardly (e.g., in a Z-direction) from an upper surface of the substrate 101, and may extend in a first direction (e.g., in an X-direction). As illustrated in FIG. 13, the active fins 115 may be arranged side by side in a second direction (e.g., a Y-direction) on the substrate 101. In the present embodiment, two active fins 115 arranged adjacently may provide a channel region for one transistor. In the present embodiment, the two active fins 115 are provided, but an example embodiment thereof is not limited thereto, and may be provided singly or in plurality (e.g., more than two).

Referring to FIGS. 13 and 15A and 15B, the semiconductor device 100A according to the present embodiment may include a source/drain region 120 formed across two active fins 115, and a contact structure 180 connected to the source/drain region 120.

In this embodiment, the fin structures may include first and second fin structures FS1 and FS2 having two active fins 115, respectively. While the two active fins 115 constituting the second fin structure FS2 have a constant (uniform) width Wb (along the first direction) in the second direction (e.g., the Y-direction), in order to realize high integration, the active fins 115 constituting the first fin structure FS1 may have portions FS1*a* and FS1*b* having different widths Wa and Wb in the second direction (e.g., the Y-direction).

Specifically, as illustrated in FIG. 13, each of the active fins 115 of the first fin structure FS1 may have a first fin portion 115A having a first width Wa and a second fin portion 115B having a second width Wb, greater than the first width Wa. The second fin structure FS2 may have the same (uniform) second width Wb, but an example embodiment thereof is not limited thereto.

The semiconductor device 100A according to the present embodiment may include a plurality of gate lines (first to third gate lines) GL1, GL2, and GL3. As illustrated in FIG. 13, the plurality of gate lines GL1, GL2, and GL3 may extend in the second direction (e.g., the Y-direction). The plurality of gate lines (each of the first to third gate lines) GL1, GL2, and GL3 may overlap one region of each of the active fins 115. Each of the plurality of gate lines GL1, GL2, and GL3 may include gate spacers 164, a gate insulating film 162 and a gate electrode 165, sequentially disposed between the gate spacers 164, and a gate capping layer 168 disposed on the gate electrode 165.

The first to third gate lines GL1, GL2, and GL3 may be arranged (spaced apart from each other) in the first direction (e.g., the X-direction). As illustrated in FIG. 13, the first gate line GL1 may be disposed on (to cross) the first fin portion FS1*a* and the second fin structure FS2, respectively, and the second gate line GL2 may be disposed on (to cross) the second fin portion FS1*b* and the second fin structure FS2. The third gate line GL3 may be disposed on (to cross) the second fin structure FS2. The third gate line GL3 may be overlapped with a device isolation pattern 170' in the first direction (e.g., the X-direction).

The device isolation pattern 170' may extend in a second direction (e.g., the Y-direction) between the first fin portion FS1*a* and the second fin portion FS1*b*, and may be connected to one end of the third gate line GL3. As illustrated in FIG. 14, the device isolation pattern 170' may extend in a third direction (e.g., Z-direction) toward the substrate 101 so that the first fin structure FS1 may be separated into first and second fin portions FS1*a* and FS1*b*. The device isolation pattern 170' may remove at least a portion of a region whose width is changed in the first fin structure FS1. The device isolation pattern 170' may have a lower surface than that of the source/drain regions 120 (e.g., the source/drain regions 120 adjacent to the device isolation pattern 170' in the first fin structure FS1). As illustrated in FIG. 14, the device isolation pattern 170' may be formed to be deeper than the active fin 115. A width W4 of the device isolation pattern 170' may be (substantially) the same as the width W3 of the third gate line GL3 or may be slightly wider than the width W3, but not greater than 120% thereof. The device isolation pattern 170' may include, for example, silicon nitride (SiN), silicon oxynitride (SiON), silicon carbonitride (SiCN), or silicon oxycarbonitride (SiOCN), but not limited thereto.

According to an "arranging method of gate lines" of the present embodiment, one gate line (e.g., the third gate line GL3) may be located in a width change region of the first fin structure FS1, the other gate lines (e.g., the first and second gate lines GL1 and GL2), adjacent thereto may be arranged to be located in the first and second fin portions FS1*a* and FS1*b* having a constant (uniform) width. The width change region may be removed by a partial cut process of the one gate line (e.g., the third gate line GL3), and the first and second gate lines GL1 and GL2 may be disposed in a region in which a width in the second direction is not substantially changed (uniform along the first direction) in the first and second fin portions FS1*a* and FS1*b*, respectively.

As described above, according to the present embodiment, a gate line (e.g., the third gate line GL3) may be arranged in a width change region of the active fins, and a device isolation pattern (e.g., the device isolation pattern 170') may be formed by removing a portion of the width change region and a portion of the gate line located on the width change region to prevent defects due to the width change region.

Although, in the above-described embodiment, a form of realizing desired arrangement of gate lines without changing the width and/or pitch of the gate lines in the first direction (e.g., X-direction) is illustrated, by changing a pitch P3 of a third gate line GL3 and first and second gate lines GL1 and GL2 adjacent thereto and changing a width W3 of the third gate line GL3, the desired arrangement of gate lines may be implemented as well (refer to FIGS. 16 to 20).

Figure 16:
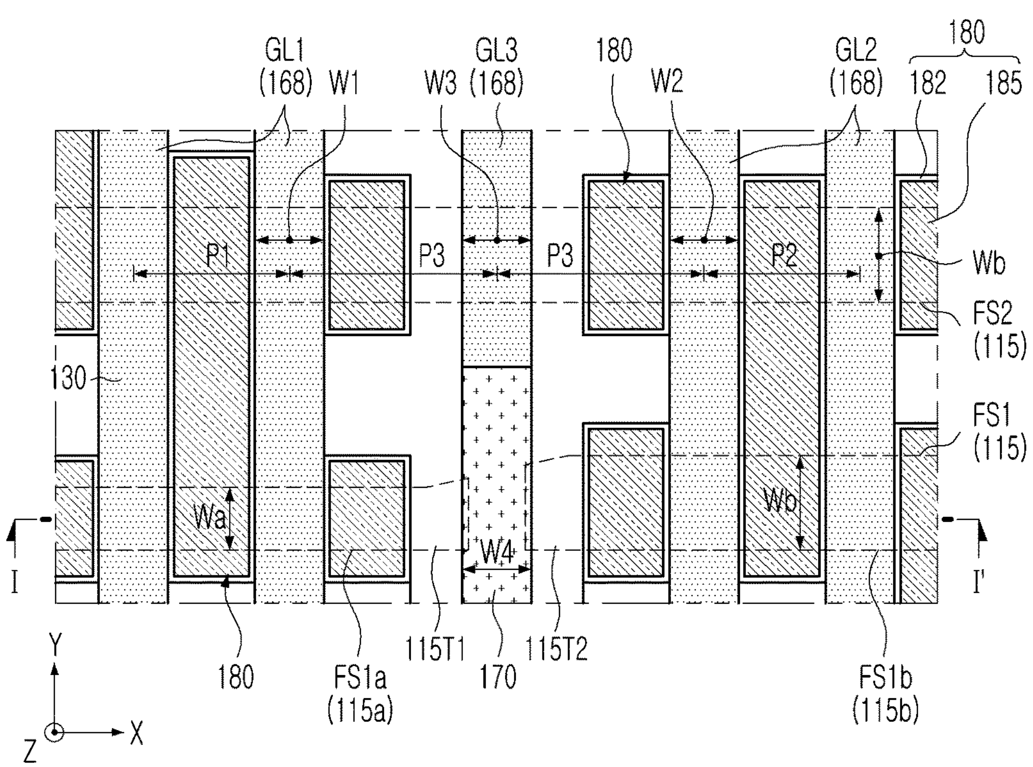
FIG. 16 is a plan view illustrating a semiconductor device according to an example embodiment.
Figure 17:
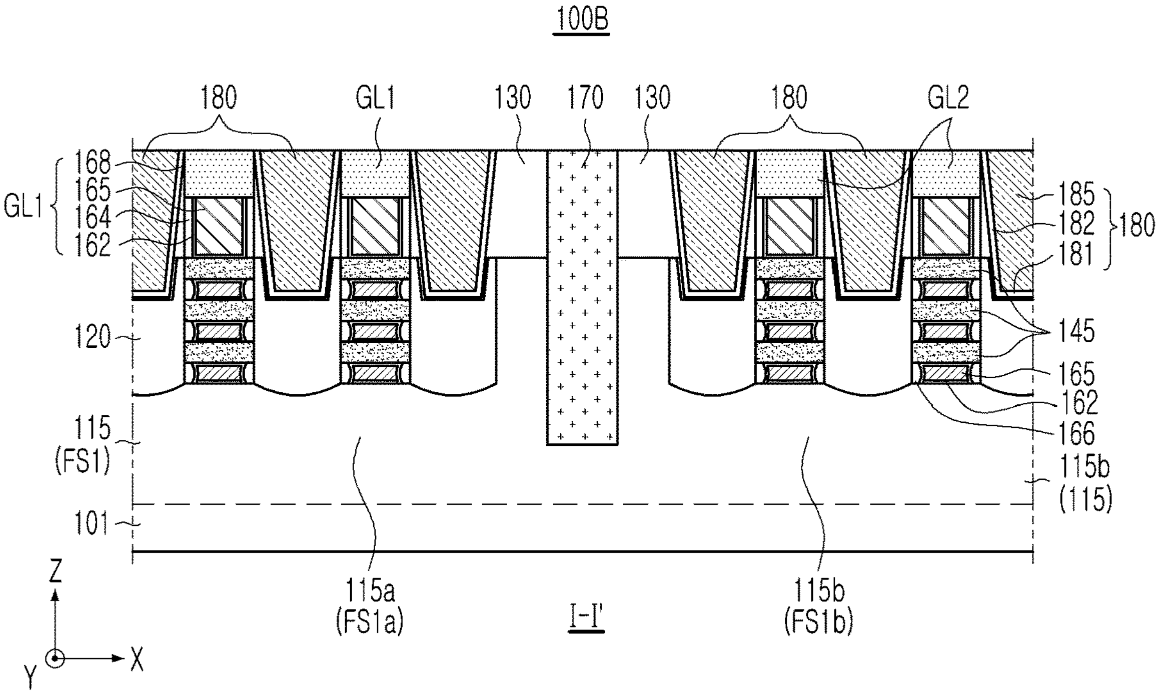
FIG. 17 is a cross-sectional view of the semiconductor device of FIG. 16 taken along line I-I'.

FIG. 16 is a plan view illustrating a semiconductor device 100B according to an example embodiment of the present inventive concept, and FIG. 17 is a cross-sectional view of the semiconductor device 100B of FIG. 16 taken along line I-I'.

Referring to FIGS. 16 and 17, the semiconductor device 100B according to the present embodiment may be similar to the semiconductor device 100 illustrated in FIGS. 1 to 3B, except that a third pitch P3 between the third gate line GL3 and the first and second gate lines GL1 and GL2, adjacent thereto is changed. In addition, the components of the present embodiment may be understood with reference to descriptions of the same or similar components of the semiconductor device 100 illustrated in FIGS. 1 to 3B unless otherwise specified.

Referring to FIG. 16, similarly to the previous embodiments, a first width W1 of the first gate lines GL1 in the first direction and a second width W2 of the second gate lines GL2 in the first direction may be the same as (equal to) each other, and the third gate line GL3 may have a third width W3 in the first direction that is the same as (equal to) the first and second widths W1 and W2. However, unlike the previous embodiments, although the first pitch P1 between the first gate lines GL1 and the second pitch P2 between the second gate lines GL2 may be the same as (equal to) each other, the third pitch P3 between the third gate line GL3 and the first and second gate lines GL1 and GL2, adjacent thereto may be different from the first and second pitches P1 and P2. The third pitch P3 may be larger than the first and second pitches P1 and P2.

In the present embodiment, the semiconductor device 100B may include remaining tapered portions 115T1 and 115T2 at opposite ends of the first and second fin portions FS1*a* and FS1*b*. A portion of a tapered region (e.g., width change region) of the first fin structure FS1 may be removed by a device isolation pattern 170, but the other portions of the tapered region (e.g., the remaining tapered portions 115T1 and 115T2) may remain depending on a width W4 of the device isolation pattern 170 in the first direction. Specifically, when the tapered region of the first fin structure FS1 has a relatively wide width in the first direction (e.g., the X-direction), the third gate line GL3 with the width W3 (or the device isolation pattern 170 with the width W4) may not entirely cover the tapered region of the first fin structure FS1. For example, the tapered portion 115T (e.g., the remaining tapered portions 114T1 and 115T2) may be in contact with the device isolation pattern 170. The tapered portion 115T may have a width in second direction that may increase (or decrease) toward the device isolation pattern 170.

In the present embodiment, since the third gate line GL3 (or device isolation pattern 170) may be arranged at a third pitch P3, which is greater than the first and second pitches P1 and P2, the first and second gate lines GL1 and GL2 may not be on the remaining tapered portions 115T1 and 115T2 but on portions of the first and second fin portions FS1*a* and FS1*b* having a constant (e.g., uniform along the first direction) width in the second direction. As described above, by adjusting the third pitch P3 between the third gate line GL3, the first and second gate lines GL1 and GL2 adjacent to the third gate line GL3, may be arranged so as not to form an acute angle with the first fin structure FS1.

Figure 18C:
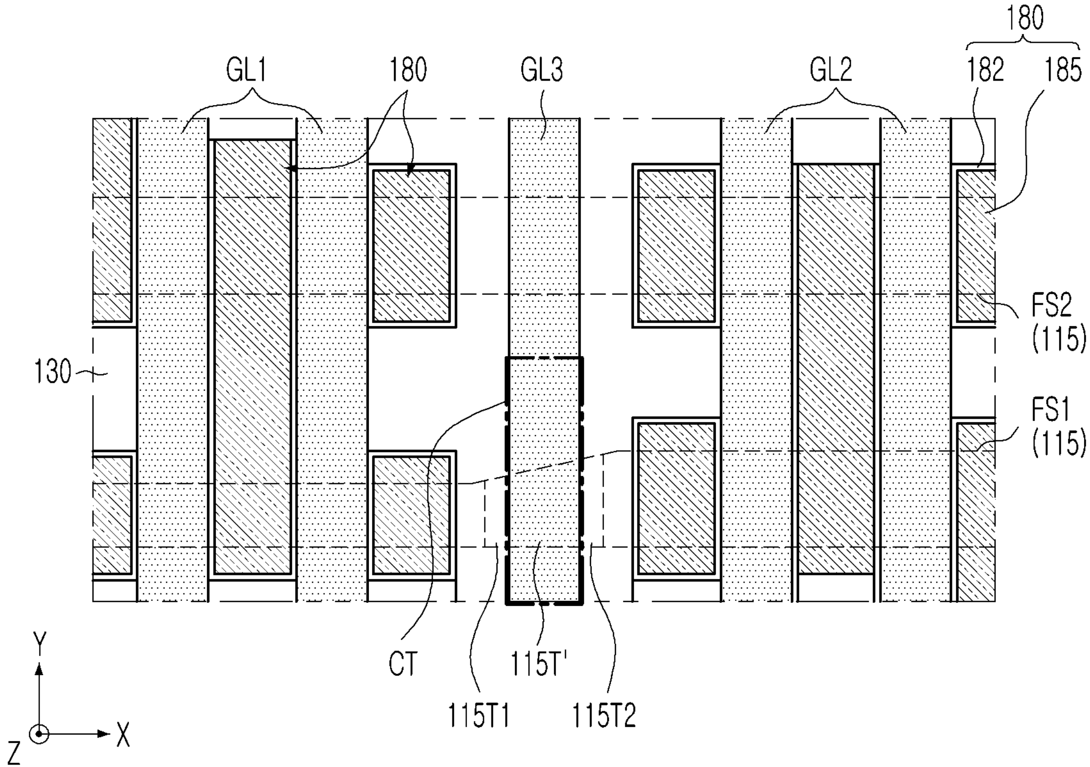
FIG. 18C is a plan view a source/drain region, illustrating the method of manufacturing the semiconductor device of FIG. 17.

FIGS. 18A to 18C are plan views for each main process, illustrating the method of manufacturing the semiconductor device 100B of FIG. 16, respectively.

Referring to FIG. 18A, first and second fin structures FS1 and FS2 may extend in a first direction (e.g., X-direction) on a substrate 101, respectively, and may be spaced apart from each other in a second direction (e.g., Y-direction). The first and second fin structures FS1 and FS2 may be formed by removing, for example, a stack structure of the sacrificial layers 141 and the nanosheets 145 and a portion of the substrate 101 by the process described with reference to FIGS. 5A and 5B.

The second fin structure FS2 may be formed to have a constant (e.g., uniform along the first direction) width Wb in the second direction (e.g., Y-direction). On the other hand, the first fin structure FS1 may be formed to have a first fin portion FS1*a* having a first width Wa in the second direction and a second fin portion FS1*b* having a second width Wb in the second direction, greater than the first width Wa. In the first fin structure FS1, a "tapered portion" 115T having a changed width (between the first width Wa and the second width Wb) in the second direction may be formed between the first fin portion FS1*a* and the second fin portion FS1*b*.

Next, referring to FIG. 18B, line-shaped sacrificial gate structures 150 may be formed to define the first to third gate lines GL1, GL2, and GL3 that will be formed in subsequent processes (see FIGS. 6A and 6B). One sacrificial gate structure 150 may be disposed on the tapered portion 115T of the first fin structure FS1, and other sacrificial gate structures 150 adjacent thereto may deviate from the tapered portion 115T and may be on the other portions of the first and second fin portions FS1*a* and FS1*b* having a constant (e.g., uniform along the first direction) width in the second direction.

For this arrangement, as described above, while the sacrificial gate structure 150 may have the same width (W1=W2=W3) in the first direction, by increasing a pitch P3 between a sacrificial gate structure 150 to be positioned in the tapered portion 115T and a sacrificial gate structure 150, adjacent thereto, other adjacent sacrificial gate structures 150 may deviate from the tapered portion 115T, and be aligned in the first and second fin portions FS1*a* and FS1*b* having constant (e.g., uniform along the first direction) widths in the second direction.

Next, referring to FIG. 18C, gate lines (e.g., first to third gate lines GL1, GL2, and GL3) may be formed by replacing sacrificial gate structures 150, a source/drain region 120 may be formed (see FIGS. 7 to 12), and a contact plug 180 penetrating through the interlayer insulating layer 130 and connected to the source/drain region 120 may be formed.

A tapered portion 115T, which may be a width change region of the first fin structure FS1, may be removed through a partial cut process of the third gate line GL3 for the region marked "CT". In the arrangement of the first to third gate lines GL1, GL2, and GL3 according to the present embodiment, the tapered portion 115T may be removed by a partial cut process for the third gate line GL3. A device isolation pattern (refer to "170" in FIGS. 16 and 17) may be formed in the removed region.

FIGS. 19 and 20 are plan views illustrating semiconductor devices 100C according to various example embodiments of the present inventive concept.

First, referring to FIG. 19, the semiconductor device 100C may be similar to the semiconductor device 100 illustrated in FIGS. 1 to 3B except that a sacrificial gate structure 150 positioned in a tapered portion 115T has a width W3 in the first direction, greater than widths W1 and W2 of other sacrificial gate structures 150 in the first direction. In addition, the components of the present embodiment may be understood with reference to descriptions of the same or similar components of the semiconductor device 100 illustrated in FIGS. 1 to 3B unless otherwise specified.

In this embodiment, similar to the embodiments illustrated in FIGS. 16 and 17, the second fin structure FS2 may be formed to have a constant (e.g., uniform along the first direction) width Wb in the second direction, while the first fin structure FS1 may be formed to have a first fin portion FS1*a* having a first width Wa in the second direction and a second fin portion FS1*b* having a second width Wb in the second direction, greater than the first width Wa. A tapered portion 115T in which a width in the second direction is changed may be formed between the first fin portion FS1*a* and the second fin portion FS1*b*, adjacent to each other.

As illustrated in FIG. 19, line-shaped sacrificial gate structures 150 may be formed to define the first to third gate lines GL1, GL2, and GL3 that will be formed in subsequent processes. The sacrificial gate structures 150 may be arranged at a constant (uniform) pitch (P1=P2=P3). One sacrificial gate structure 150 may be on the tapered portion 115T of the first fin structure FS1, and other sacrificial gate structures 150 adjacent thereto, may deviate from the tapered portion 115T and may be arranged on the first and second fin portions FS1*a* and FS1*b* having a constant (e.g., uniform along the first direction) width in the second direction. In the present embodiment, the sacrificial gate structure 150 positioned in the tapered portion 115T may have a width W3 in the first direction greater than the widths W1 and W2 of the other sacrificial gate structures 150 in the first direction. For example, the sacrificial gate structure 150 may have a sufficient width W3 to cover the tapered portion 115T, and after the sacrificial gate structure 150 is replaced by a gate line (e.g., the third gate line GL3), a device isolation pattern 170 may be formed. The device isolation pattern 170 may remove the entire tapered portion 115T. As a result, the first and second fin portions FS1*a* and FS1*b* may have constant (e.g., uniform along the first direction) widths Wa and Wb in the second direction, respectively. In the present embodiment, since the sacrificial gate structures 150 having the wide width W3 in the first direction may be arranged at the same pitch (P1=P2=P3), a distance d2 between the sacrificial gate structure on the tapered portion 115T and adjacent sacrificial gate structures 150 thereto may be smaller than a distance d1 between the other sacrificial gate structures 150.

Referring to FIG. 20, the semiconductor device 100D according to the present embodiment may be similar to the semiconductor device 100 illustrated in FIGS. 1 to 3B, except that a sacrificial gate structure 150 located in the tapered portion 115T may have a width W3 in the first direction, greater than the widths W1 and W2 of the other sacrificial gate structures 150 in the first direction, and may be arranged at a pitch P3, different from the pitches P1 and P2 between the other sacrificial gate structures 150. In addition, the components of the present embodiment may be understood with reference to descriptions of the same or similar components of the semiconductor device 100 illustrated in FIGS. 1 to 3B unless otherwise specified.

In this embodiment, similar to the previous embodiments, the second fin structure FS2 may be formed to have a constant (e.g., uniform along the first direction) width Wb in the second direction, while the first fin structure FS1 may be formed to have a first fin portion FS1*a* having a first width Wa in the second direction and a second fin portion FS1*b* having a second width Wb in the second direction, greater than the first width Wa. A tapered portion 115T in which a width in the second direction is changed may be formed between the first fin portion FS1*a* and the second fin portion FS1*b*, adjacent to each other.

The sacrificial gate structures 150 employed in this embodiment may be arranged similarly to the arrangement described in FIG. 18B. Specifically, one sacrificial gate structure 150 may be disposed on the tapered portion 115T of the first fin structure FS1 at a third pitch P3 with sacrificial gate structures 150 adjacent thereto. The other sacrificial gate structures 150 deviated away from the tapered portion 115T may be arranged at first and second pitches P1 and P2, which may be smaller than the third pitch P3 in the first and second fin portions FS1*a* and FS1*b* having a constant (uniform) width in the second direction.

In addition, similar to the example embodiment illustrated in FIG. 19, the sacrificial gate structure 150 positioned in the tapered portion 115T may have a width W3 in the first direction greater than the widths W1 and W2 of the other sacrificial gate structures 150 in the first direction. For example, the sacrificial gate structure 150 may have a sufficient width W3 to cover the entire tapered portion 115T.

As described above, by changing the pitch P3 of the third gate line GL3 and the first and second gate lines GL1 and GL2 adjacent thereto and/or the width W3 of the third gate line GL3 in the first direction, various arrangements of desired gate lines may be implemented.

As set forth above, according to the present embodiment, gate lines may be arranged so that only one gate line is located on a portion of a fin structure (e.g., active pattern) of which a width is changed. The portion of the fin structure in which the width is changed may be removed together with a gate line that is located on such portion, to form a device isolation pattern, so that a defect (e.g., short defect of epitaxial pattern) due to a tapered portion of the fin structure may be prevented.

In some example embodiments, a desired layout of the gate lines may be implemented by adjusting a width and/or pitch of the gate lines. Herein, a lower side, a lower portion, a lower surface, and the like, are used to refer to a direction toward a substrate in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer as well as a direct connection between two components with or without intervening layers or components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor device, comprising:

a substrate;

a first fin structure extending on the substrate in a first direction, and having a first fin portion having a first width in a second direction crossing the first direction and a second fin portion having a second width in the second direction, greater than the first width;

a second fin structure extending on the substrate in the first direction, and having the second width in the second direction;

a plurality of first gate lines that comprises a first gate line, on the first fin portion of the first fin structure and the second fin structure, wherein the plurality of first gate lines is extending in the second direction;

a plurality of second gate lines that comprises a second gate line, on the second fin portion of the first fin structure and the second fin structure, wherein the plurality of second gate lines is extending in the second direction;

a third gate line on the second fin structure, wherein the third gate line is extending in the second direction between the first gate line and the second gate line, wherein the first gate line, the second gate line, and the third gate line control active regions of the semiconductor device; and a device isolation pattern connected to an end portion of the third gate line, and extending between the first fin portion of the first fin structure and the second fin portion of the first fin structure.

2. The semiconductor device of claim 1, wherein the first gate line has a first gate width in the first direction, the second gate line has a second gate width in the first direction, and the third gate line has a third gate width in the first direction, and wherein the first gate width of the first gate line, the second gate width of the second gate line, and the third gate width of the third gate line are equal to each other.

3. The semiconductor device of claim 2, wherein the plurality of first gate lines are arranged at a first pitch in the first direction, the plurality of second gate lines are arranged at a second pitch in the first direction, the first gate line and the third gate line are arranged at a third pitch in the first direction, and the second gate line and the third gate line are arranged at the third pitch in the first direction, and wherein the first pitch, the second pitch, and the third pitch are equal to each other.

4. The semiconductor device of claim 3, wherein the first width of the first fin portion and the second width of the second fin portion are uniform along the first direction.

5. The semiconductor device of claim 3, wherein the first fin portion of the first fin structure comprises a first tapered portion in contact with the device isolation pattern, and the first tapered portion has a width in the second direction, increasing toward the device isolation pattern.

6. The semiconductor device of claim 3, wherein the first fin portion of the first fin structure comprises a second tapered portion in contact with the device isolation pattern, and the second tapered portion has a width in the second direction decreasing toward the device isolation pattern.

7. The semiconductor device of claim 1, wherein the first gate line has a first gate width in the first direction, the second gate line has a second gate width in the first direction, and the third gate line has a third gate width in the first direction, and wherein the first gate width and the second gate width are equal to each other, and the third gate width is greater than the first and second gate widths.

8. The semiconductor device of claim 7, wherein the plurality of first gate lines are arranged at a first pitch in the first direction, the plurality of second gate lines are arranged at a second pitch in the first direction, the first gate line and the third gate line are arranged at a third pitch in the first direction, and the second gate line and the third gate line are arranged at the third pitch in the first direction, and wherein the first pitch, the second pitch, and the third pitch are equal to each other.

9. The semiconductor device of claim 7, wherein the plurality of first gate lines are arranged at a first pitch in the first direction, the plurality of second gate lines are arranged at a second pitch in the first direction, the first gate line and the third gate line are arranged at a third pitch in the first direction, and the second gate line and the third gate line are arranged at the third pitch in the first direction, wherein the first pitch and the second pitch are equal to each other, and wherein the third pitch is greater than the first pitch and the second pitch.

10. The semiconductor device of claim 1, wherein the device isolation pattern has a width in the first direction, substantially equal to a third gate width of the third gate line in the first direction.

11. The semiconductor device of claim 1, wherein each of the first and second fin structures comprises a plurality of channel layers spaced apart from each other in a third direction perpendicular to an upper surface of the substrate, wherein each of the first, second, and third gate lines comprises a gate electrode on the plurality of channel layers and extending in the second direction, a gate insulating film between the plurality of channel layers and the gate electrode, and a gate capping layer on the gate electrode.

12. The semiconductor device of claim 1, wherein each of the first and second fin structures has an active fin extending in the first direction, wherein each of the first, second, and third gate lines comprises a gate insulating film on the active fin, a gate electrode on the gate insulating film, and a gate capping layer on the gate electrode.

13. The semiconductor device of claim 1, further comprising:

first source/drain regions respectively disposed in the first fin structure on opposing sides of each of the first and second gate lines, and second source/drain regions respectively disposed in the second fin structure on opposing sides of each of the first to third gate lines.

14. The semiconductor device of claim 13, wherein the device isolation pattern is positioned between adjacent first source/drain regions among the first source/drain regions, and has a surface that is lower than lower surfaces of the adjacent first source/drain regions relative to the substrate.

15. A semiconductor device, comprising:

a substrate;

a first fin structure extending on the substrate in a first direction, and having a first fin portion having a first width in a second direction crossing the first direction and a second fin portion having a second width, greater than the first width, in the second direction;

a second fin structure extending on the substrate in the first direction, and having the second width in the second direction;

first gate lines on the first fin portion and the second fin structure, and extending in the second direction;

second gate lines on the second fin portion and the second fin structure, and extending in the second direction;

a third gate line on the second fin structure, and extending in the second direction between the first gate lines and the second gate lines;

a first epitaxial pattern on the first fin portion, wherein the first epitaxial pattern is adjacent to the second fin portion;

a second epitaxial pattern on the second fin portion, wherein the second epitaxial pattern is adjacent to the first fin portion; and a device isolation pattern separating the first fin portion and the second fin portion between the first epitaxial pattern and the second epitaxial pattern, the device isolation pattern contacting an end portion of the third gate line, and extending from the end portion of the third gate line.

16. The semiconductor device of claim 15, wherein each of the first and second gate lines has the same width as each other in the first direction, and the third gate line has the same width in the first direction as the width of each of the first and second gate lines in the first direction.

17. The semiconductor device of claim 15, wherein each of the first and second gate lines has the same width as each other in the first direction, and the third gate line has a width in the first direction, greater than each width of the first and second gate lines in the first direction.

18. The semiconductor device of claim 15, wherein the first gate lines and the second gate lines are arranged at a first distance from each other and a second distance from each other, respectively, and respective distances between the device isolation pattern and the first and second gate lines, adjacent thereto are smaller than the first distance and the second distance, respectively.

19. A semiconductor device, comprising:

a substrate;

a first fin structure extending on the substrate in a first direction, and having a first fin portion having a first width in a second direction crossing the first direction and a second fin portion having a second width in the second direction, greater than the first width;

a second fin structure extending on the substrate in the first direction, and having the second width in the second direction;

first gate lines extending in the second direction on the first fin portion and the second fin structure, and arranged at a first pitch in the first direction;

second gate lines extending in the second direction on the second fin portion and the second fin structure, and arranged at the first pitch in the first direction;

a third gate line on the second fin structure, wherein the third gate line is extending in the second direction between the first gate lines and the second gate lines, and the third gate line is arranged with the first and second gate lines, adjacent thereto, at a second pitch in the first direction, greater than the first pitch;

a first epitaxial pattern on the first fin portion, wherein the first epitaxial pattern is adjacent to the second fin portion;

a second epitaxial pattern on the second fin portion, wherein the second epitaxial pattern is adjacent to the first fin portion; and a device isolation pattern separating the first fin portion and the second fin portion between the first epitaxial pattern and the second epitaxial pattern, and connected to an end portion of the third gate line.

20. The semiconductor device of claim 19, wherein a width of the device isolation pattern in the first direction is greater than a width of the first and second gate lines in the first direction.

* * * * *